US012587180B2

(12) United States Patent
Granger-Jones et al.

(10) Patent No.: US 12,587,180 B2
(45) Date of Patent: Mar. 24, 2026

(54) GROUP DELAY DETERMINATION IN A COMMUNICATION CIRCUIT

(71) Applicant: Qorvo US, Inc., Greensboro, NC (US)

(72) Inventors: Marcus Granger-Jones, Scotts Valley, CA (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 652 days.

(21) Appl. No.: 17/974,930

(22) Filed: Oct. 27, 2022

(65) Prior Publication Data

US 2023/0132888 A1    May 4, 2023

Related U.S. Application Data

(60) Provisional application No. 63/275,589, filed on Nov. 4, 2021.

(51) Int. Cl.
  *H03F 3/24*        (2006.01)
  *H03F 1/02*        (2006.01)
  (Continued)

(52) U.S. Cl.
  CPC ............. *H03K 5/01* (2013.01); *H03F 1/0222* (2013.01); *H03F 3/245* (2013.01); *H03F 2200/451* (2013.01); *H03K 2005/00013* (2013.01)

(58) Field of Classification Search
  CPC ........ H03F 1/02; H03F 1/0222; H03F 1/0227; H03F 3/19; H03F 3/24; H03F 3/245;
  (Continued)

(56) References Cited

U.S. PATENT DOCUMENTS 8,344,806 B1 *    1/2013    Franck ................... H03F 3/195
                                                                330/285
9,553,742 B1 *    1/2017    Xu ...................... H04L 25/0384
  (Continued)

FOREIGN PATENT DOCUMENTS

EP        3070839 A1      9/2016
KR    101397548 B1      5/2014

OTHER PUBLICATIONS

Extended European Search Report for European Patent Application No. 22201414.4, mailed Feb. 27, 2023, 10 pages.
  (Continued)

*Primary Examiner* — Shawkat M Ali
(74) *Attorney, Agent, or Firm* — Withrow & Terranova, P.L.L.C.

(57)        ABSTRACT
Group delay determination in a communication circuit is disclosed. The communication circuit includes a power amplifier circuit that amplifies a radio frequency (RF) signal based on a modulated voltage and a power management integrated circuit (PMIC) that generates the modulated voltage. Herein, the PMIC includes a group delay determination circuit to determine a relative group delay between the modulated voltage and a modulated current, which is internal to the power amplifier circuit and unknown to the PMIC, solely based on signals known to the PMIC. The determined relative group delay can help to time align the modulated voltage with the modulated current at the power amplifier circuit to improve error vector magnitude (EVM) and/or adjacent channel leakage ratio (ACLR). Further, by determining the relative group delay based on known signals to the PMIC, it is possible to achieve good time alignment between the modulated voltage and the modulated current.

20 Claims, 13 Drawing Sheets

(51) Int. Cl.
    *H03K 5/01*       (2006.01)
    *H03K 5/00*       (2006.01)

(58) Field of Classification Search
    CPC .................. H03K 5/01; H03K 5/1536; H03K
                    2005/00013; H04B 1/00; H04B 1/04;
                    H04B 1/40; H04L 25/03; H04L 25/49;
                    H04L 27/36
    USPC ......... 330/127; 375/239, 295–297; 455/63.1,
                    455/127.1
    See application file for complete search history.

(56) References Cited

U.S. PATENT DOCUMENTS

| | | | |
|---|---|---|---|
| 10,197,605 B2 | 2/2019 | Quiquempoix et al. | |
| 12,028,024 B2 * | 7/2024 | Srinivasan ............... | H03K 5/00 |
| 2005/0036400 A1 | 2/2005 | Chen | |
| 2008/0242246 A1 | 10/2008 | Minnis et al. | |
| 2016/0365836 A1 | 12/2016 | Khlat et al. | |
| 2020/0259685 A1 | 8/2020 | Khlat | |
| 2023/0121439 A1 | 4/2023 | Granger-Jones et al. | |

OTHER PUBLICATIONS

Extended European Search Report for European Patent Application No. 22205428.0, mailed Mar. 16, 2023, 11 pages.

Hussain, S., "Fast and Efficient Encoder with concurrent Bubble error correction for Flash ADC," International Journal of Modern Trends in Engineeringand Research, Jul. 2-4, 2015, IJMTER-2015, 9 pages.

Monticelli, D.M, "A quad CMOS single-supply op amp with rail-to-rail output swing," IEEE Journal of Solid-State Circuits, vol. 21, Issue 6, Dec. 1986, 9 pages.

Pardhu, T. et al., "A low power flash ADC with Wallace tree encoder," 2014 Eleventh International Conference on Wireless and Optical Communications Networks (WOCN), Sep. 11-13, 2014, Vijayawada, India, IEEE, 4 pages.

* cited by examiner

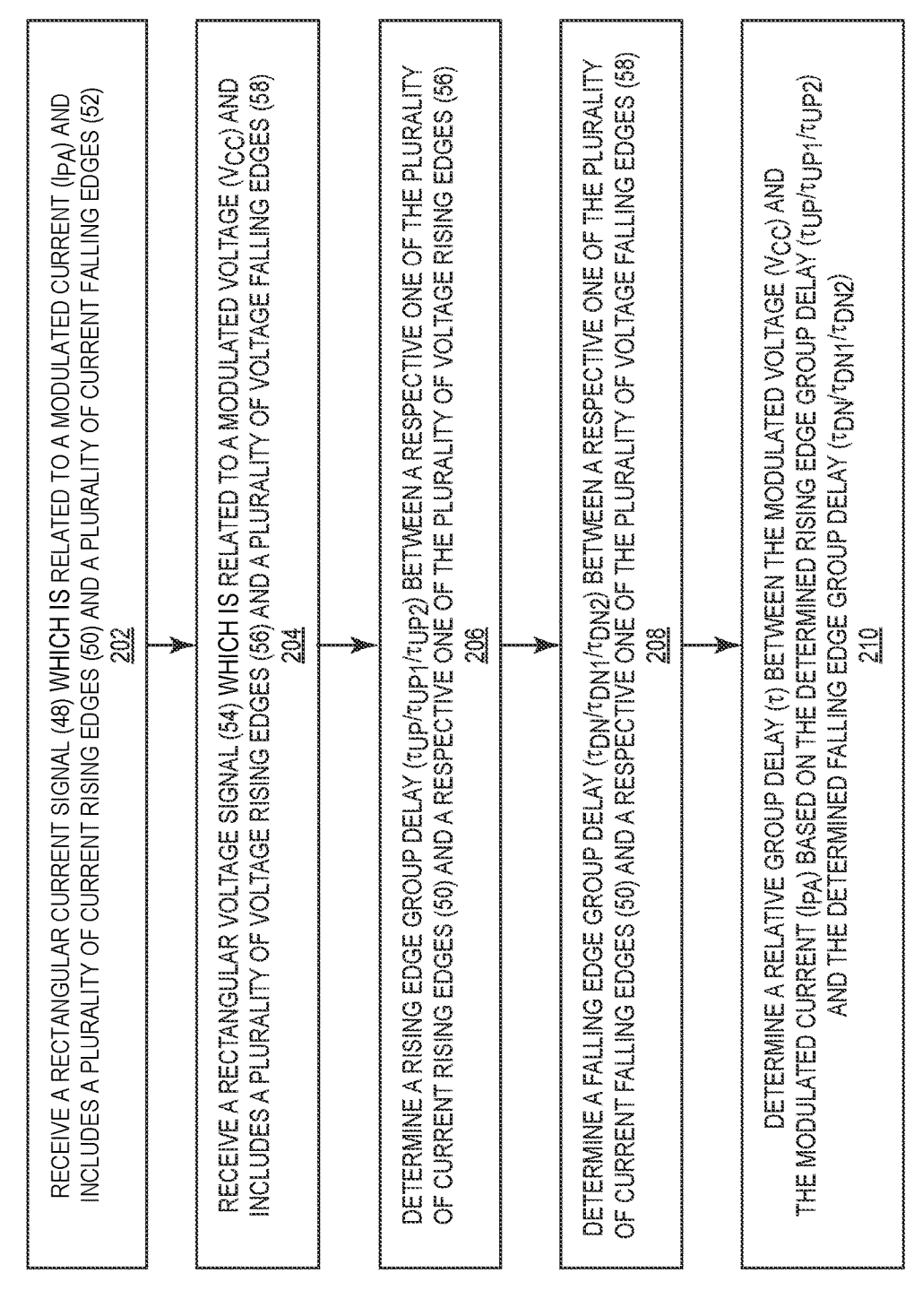

200

RECEIVE A RECTANGULAR CURRENT SIGNAL (48) WHICH IS RELATED TO A MODULATED CURRENT ($I_{PA}$) AND INCLUDES A PLURALITY OF CURRENT RISING EDGES (50) AND A PLURALITY OF CURRENT FALLING EDGES (52)
202

RECEIVE A RECTANGULAR VOLTAGE SIGNAL (54) WHICH IS RELATED TO A MODULATED VOLTAGE ($V_{CC}$) AND INCLUDES A PLURALITY OF VOLTAGE RISING EDGES (56) AND A PLURALITY OF VOLTAGE FALLING EDGES (58)
204

DETERMINE A RISING EDGE GROUP DELAY ($\tau_{UP}/\tau_{UP1}/\tau_{UP2}$) BETWEEN A RESPECTIVE ONE OF THE PLURALITY OF CURRENT RISING EDGES (50) AND A RESPECTIVE ONE OF THE PLURALITY OF VOLTAGE RISING EDGES (56)
206

DETERMINE A FALLING EDGE GROUP DELAY ($\tau_{DN}/\tau_{DN1}/\tau_{DN2}$) BETWEEN A RESPECTIVE ONE OF THE PLURALITY OF CURRENT FALLING EDGES (50) AND A RESPECTIVE ONE OF THE PLURALITY OF VOLTAGE FALLING EDGES (58)
208

DETERMINE A RELATIVE GROUP DELAY ($\tau$) BETWEEN THE MODULATED VOLTAGE ($V_{CC}$) AND THE MODULATED CURRENT ($I_{PA}$) BASED ON THE DETERMINED RISING EDGE GROUP DELAY ($\tau_{UP}/\tau_{UP1}/\tau_{UP2}$) AND THE DETERMINED FALLING EDGE GROUP DELAY ($\tau_{DN}/\tau_{DN1}/\tau_{DN2}$)
210

FIG. 10

GROUP DELAY DETERMINATION IN A COMMUNICATION CIRCUIT

RELATED APPLICATIONS

This application claims the benefit of U.S. provisional patent application Ser. No. 63/275,589, filed on Nov. 4, 2021, the disclosure of which is hereby incorporated herein by reference in its entirety.

FIELD OF THE DISCLOSURE

The technology of the disclosure relates generally to determining a group delay in a communication circuit, such as a wireless transmission circuit.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third generation (3G) and fourth generation (4G) communication systems. A 5G-NR mobile communication device usually transmits and receives a radio frequency (RF) signal (s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) and average power tracking (APT) are power management techniques designed to improve operating efficiency of the power amplifier(s). Specifically, the power amplifier(s) is configured to amplify the RF signal(s) based on a modulated voltage (ET voltage or APT voltage) that closely tracks a time-variant power envelope of the RF signal(s). The time-variant voltage is typically generated by a power management integrated circuit (PMIC) in the wireless communication device. Notably, the modulated voltage and the RF signal(s) may have experienced different group delays when arriving at the power amplifier(s). Herein, a group delay refers generally to a sum of time delay experienced by a signal propagating through one or more active/passive circuits of different processing capabilities and/or operating frequencies. As a result, the modulated voltage may become misaligned with the time-variant power envelope of the RF signal(s) at the power amplifier(s) to therefore cause a degraded error vector magnitude (EVM) and/or adjacent channel leakage ratio (ACLR) in the RF signal(s). In this regard, it is desirable to ensure that the PMIC can maintain good alignment between the modulated voltage and the time-variant power envelope of the RF signal(s).

SUMMARY

Aspects disclosed in the detailed description include group delay determination in a communication circuit. The communication circuit includes a power amplifier circuit that amplifies a radio frequency (RF) signal based on a modulated voltage and a power management integrated circuit (PMIC) that generates the modulated voltage. Herein, the PMIC includes a group delay determination circuit that is configured to determine a relative group delay between the modulated voltage and a modulated current, which is internal to the power amplifier circuit and unknown to the PMIC, solely based on signals (e.g., voltage, current, etc.) that are known to the PMIC. In an embodiment, the determined relative group delay can be used to time align the modulated voltage with the modulated current at the power amplifier circuit to thereby improve error vector magnitude (EVM) and/or adjacent channel leakage ratio (ACLR) of the RF signal. Further, by determining the relative group delay based on known signals to the PMIC, it is possible to achieve good time alignment between the modulated voltage and the modulated current. Additionally, it is possible to feed the determined relative group delay to a transceiver circuit to enable certain delay adjustments in the modulated voltage and/or the RF signal.

In one aspect, a group delay determination circuit is provided. The group delay determination circuit includes a group delay detection circuit. The group delay detection circuit is configured to receive a rectangular current signal related to a modulated current and includes multiple current rising edges and multiple current falling edges. The group delay detection circuit is also configured to receive a rectangular voltage signal related to a modulated voltage and includes multiple voltage rising edges and multiple voltage falling edges. The group delay detection circuit is also configured to determine a rising edge group delay between a respective one of the multiple current rising edges and a respective one of the multiple voltage rising edges. The group delay detection circuit is also configured to determine a falling edge group delay between a respective one of the multiple current falling edges and a respective one of the multiple voltage falling edges. The group delay determination circuit also includes a group delay output circuit. The group delay output circuit is configured to determine a relative group delay between the modulated current and the modulated voltage based on the determined rising edge group delay and the determined falling edge group delay.

In another aspect, a communication circuit is provided. The communication circuit includes a power amplifier circuit. The power amplifier circuit is configured to amplify an RF signal associated with a time-variant input power based on a modulated voltage and induce a modulated current that tracks the time-variant input power of the RF signal. The communication circuit also includes a PMIC. The PMIC includes a voltage modulation circuit. The voltage modulation circuit is configured to generate the modulated voltage based on a modulated target voltage. The PMIC also includes a group delay determination circuit. The group delay determination circuit includes a group delay detection circuit. The group delay detection circuit is configured to receive a rectangular current signal related to the modulated current and includes multiple current rising edges and multiple current falling edges. The group delay detection circuit is also configured to receive a rectangular voltage signal related to the modulated voltage and includes multiple voltage rising edges and multiple voltage falling edges. The group delay detection circuit is also configured to determine a rising edge group delay between a respective one of the multiple current rising edges and a respective one of the multiple voltage rising edges. The group delay detection circuit is also configured to determine a falling edge group delay between a respective one of the multiple current falling edges and a respective one of the multiple voltage falling edges. The group delay determination circuit also includes a group delay output circuit. The group delay output circuit is configured to determine a relative group delay between the modulated current and the modulated voltage based on the determined rising edge group delay and the determined falling edge group delay.

In another aspect, a method for determining a group delay in a communication circuit is provided. The method includes receiving a rectangular current signal related to a modulated current and includes multiple current rising edges and multiple current falling edges. The method also includes receiving a rectangular voltage signal related to a modulated voltage and includes multiple voltage rising edges and multiple voltage falling edges. The method also includes determining a rising edge group delay between a respective one of the multiple current rising edges and a respective one of the multiple voltage rising edges. The method also includes determining a falling edge group delay between a respective one of the multiple current falling edges and a respective one of the multiple voltage falling edges. The method also includes determining a relative group delay between the modulated current and the modulated voltage based on the determined rising edge group delay and the determined falling edge group delay.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 10 is a flowchart of an exemplary process that can be employed by the communication circuit of FIG. 2 for determining the relative group delay between the modulated voltage and the modulated current.

DETAILED DESCRIPTION

Figure 1A:
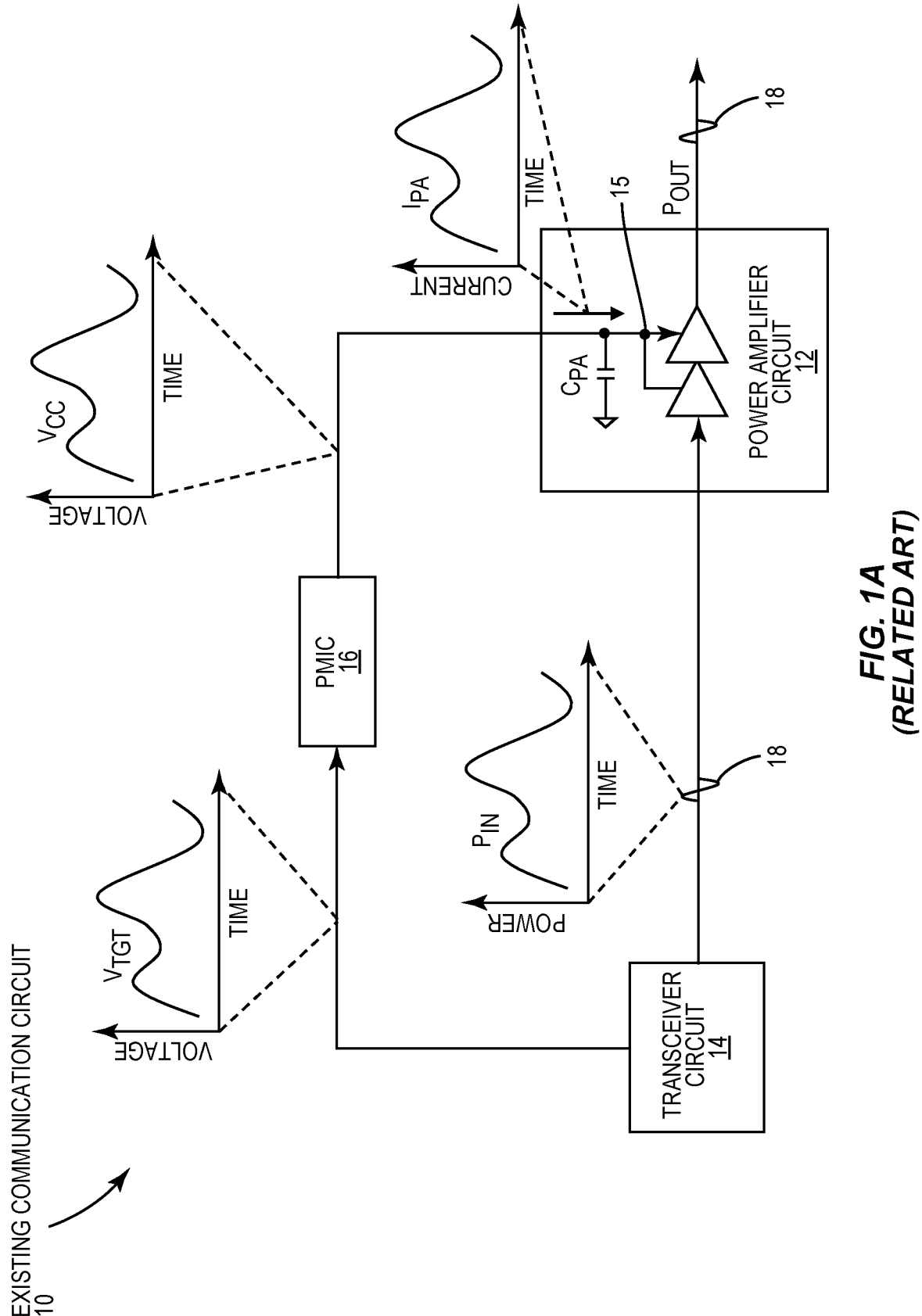
FIG. 1A is a schematic diagram of an exemplary existing communication circuit wherein a modulated voltage and a modulated current can become time misaligned at a power amplifier circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures.

It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include group delay determination in a communication circuit. The communication circuit includes a power amplifier circuit that amplifies a radio frequency (RF) signal based on a modulated voltage and a power management integrated circuit (PMIC) that generates the modulated voltage. Herein, the PMIC includes a group delay determination circuit that is configured to determine a relative group delay between the modulated voltage and a modulated current, which is internal to the power amplifier circuit and unknown to the PMIC, solely based on signals (e.g., voltage, current, etc.) that are known to the PMIC. In an embodiment, the determined relative group delay can be used to time align the modulated voltage with the modulated current at the power amplifier circuit to thereby improve error vector magnitude (EVM) and/or adjacent channel leakage ratio (ACLR) of the RF signal. Further, by determining the relative group delay based on known signals to the PMIC, it is possible to achieve good time alignment between the modulated voltage and the modulated current. Additionally, it is possible to feed the determined relative group delay to a transceiver circuit to enable certain delay adjustments in the modulated voltage and/or the RF signal.

Figure 1C:
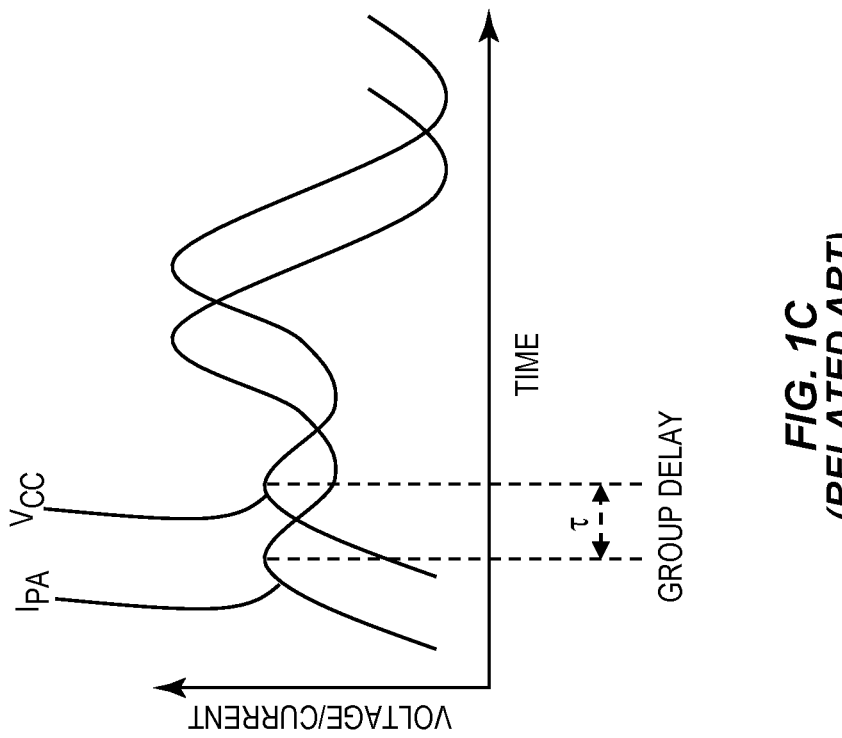
FIG. 1C is a graphic diagram providing an exemplary illustration of the modulated voltage lagging behind the modulated current.
Figure 1B:
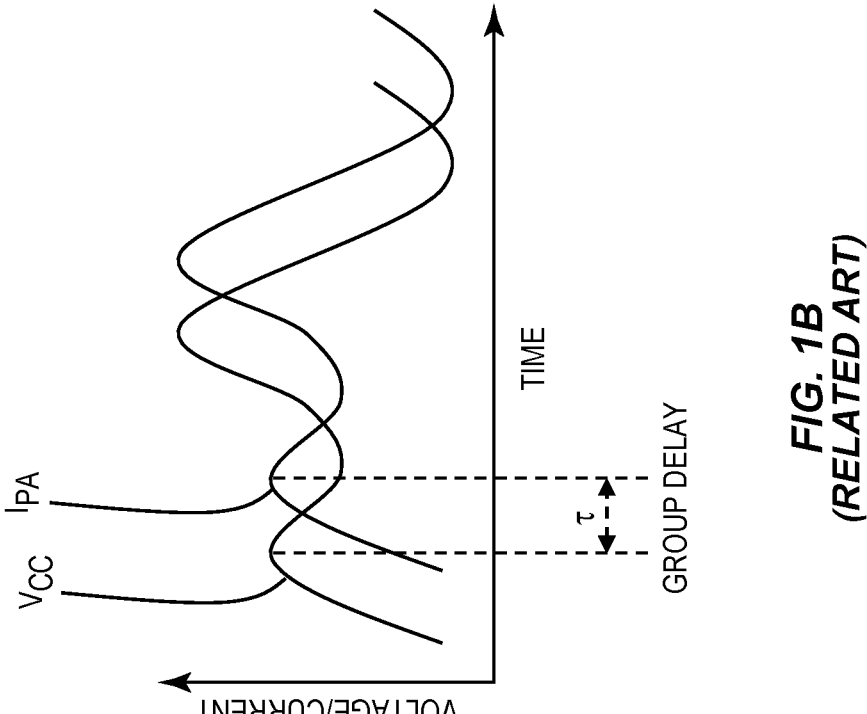
FIG. 1B is a graphic diagram providing an exemplary illustration of the modulated voltage leading the modulated current.
Figure 2:
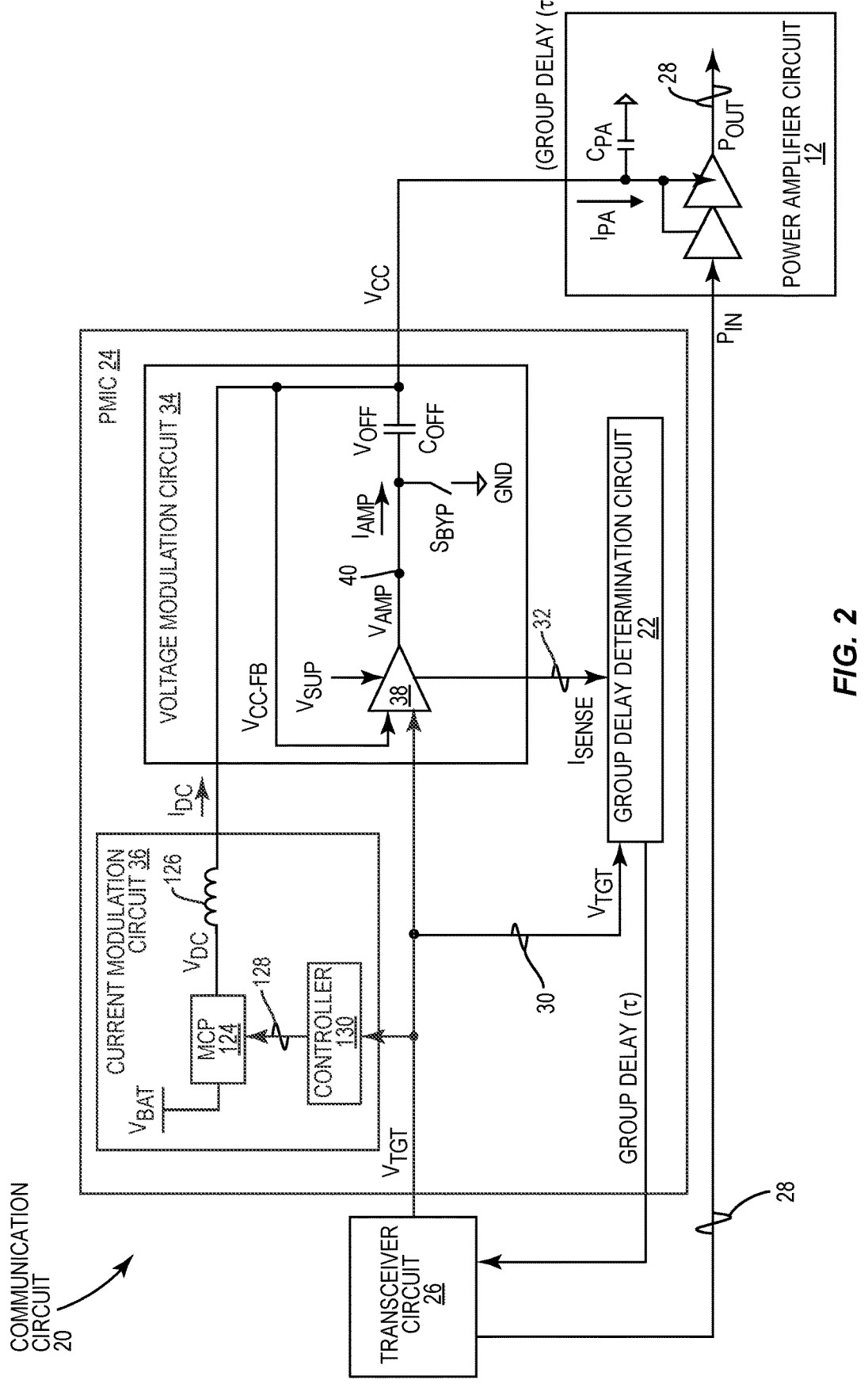
FIG. 2 is a schematic diagram of an exemplary communication circuit wherein a group delay determination circuit can be configured according to embodiments of the present disclosure to determine a relative group delay between a modulated voltage and a modulated current, which is unknown to the group delay determination circuit, solely based on signals known to the group delay determination circuit.

Before discussing group delay determination of the present disclosure, starting at FIG. 2, a brief overview of an existing communication circuit that may experience a group delay between a modulated voltage and a modulated current is first provided with reference to FIGS. 1A-1C.

FIG. 1A is a schematic diagram of an exemplary existing communication circuit 10 wherein a modulated voltage $V_{CC}$ and a modulated current $I_{PA}$ can become time misaligned at a power amplifier circuit 12. The existing communication circuit 10 also includes a transceiver circuit 14 and a PMIC 16. In context of the present disclosure, the modulated voltage $V_{CC}$ and the modulated current $I_{PA}$ are a time-variant voltage and a time-variant current, respectively, at a collector 15 of the power amplifier circuit 12.

The transceiver circuit 14 is configured to generate an RF signal 18 having a time-variant input power $P_{IN}$ and provide the RF signal 18 to the power amplifier circuit 12. The transceiver circuit 14 also generates a modulated target voltage $V_{TGT}$ that tracks the time-variant input power $P_{IN}$ and provides the modulated target voltage $V_{TGT}$ to the PMIC 16. The PMIC 16 is configured to generate a modulated voltage $V_{CC}$ that tracks the modulated target voltage $V_{TGT}$ and provides the modulated voltage $V_{CC}$ to the power amplifier circuit 12. Herein, the modulated target voltage $V_{TGT}$ and the modulated voltage $V_{CC}$ are time-variant voltages that are so generated (a.k.a. modulated) in accordance with the time-variant input power $P_{IN}$. Understandably, the transceiver circuit 14 may control (a.k.a. adjust) relative timing between the modulated target voltage $V_{TGT}$ and the RF signal 18 by delaying/advancing the modulated target voltage $V_{TGT}$ and/or the RF signal 18.

The power amplifier circuit 12 is configured to amplify the RF signal 18 from the time-variant input power $P_{IN}$ to a time-variant output power $P_{OUT}$ based on the modulated voltage $V_{CC}$. Notably, the power amplifier circuit 12 often includes a load capacitor $C_{PA}$ (e.g., 100 to 250 pF) to help provide high frequency noise filtering and to decouple the power amplifier circuit 12 from the PMIC 16. The load capacitor $C_{PA}$, however, can cause a modulated current $I_{PA}$ that closely resembles the time-variant input power $P_{IN}$ of the RF signal 18. Herein, the modulated current $I_{PA}$ is a time-variant current that varies according to a derivative of the time-variant input power $P_{IN}$ of the RF signal 18.

The modulated voltage $V_{CC}$ and the modulated current $I_{PA}$ are typically monotonically related. However, since the modulated voltage $V_{CC}$ is provided by the PMIC 16 and the modulated current $I_{PA}$ is induced internally in the power amplifier circuit 12, the modulated voltage $V_{CC}$ and the modulated current $I_{PA}$ can experience different group delays at the power amplifier circuit 12. As a result, the modulated voltage $V_{CC}$ and the modulated current $I_{PA}$ can become misaligned at the power amplifier circuit 12.

FIGS. 1B and 1C illustrate two scenarios where the modulated voltage $V_{CC}$ and the modulated current $I_{PA}$ are misaligned at the power amplifier circuit 12. Specifically, FIG. 1B shows that the modulated voltage $V_{CC}$ is ahead of (a.k.a. leading) the modulated current $I_{PA}$ by a relative group delay $\tau$ and FIG. 1C shows that the modulated voltage $V_{CC}$ is behind of (a.k.a. trailing) the modulated current $I_{PA}$ by the relative group delay $\tau$.

With reference back to FIG. 1A, the relative group delay $\tau$ can cause distortion (e.g., amplitude clipping) in the RF signal 18, which can further lead to a degraded EVM and/or ACLR in the RF signal 18. In this regard, it is desirable to eliminate the relative group delay $\tau$ between the modulated voltage $V_{CC}$ and the modulated current $I_{PA}$. Moreover, to be able to eliminate the relative group delay $\tau$, it is necessary to first measure the relative group delay $\tau$ between the modulated voltage $V_{CC}$ and the modulated current $I_{PA}$.

Conventionally, the relative group delay $\tau$ is measured at the power amplifier circuit 12 with a calibration/test equipment of some sort. This proves to be a challenging task given the fact that the existing communication circuit 10 often employs multiple power amplifier circuits made by different vendors. In this regard, it is further desirable to determine the relative group delay $\tau$ without complexity associated with the conventional approach.

FIG. 2 is a schematic diagram of an exemplary communication circuit 20, wherein a group delay determination circuit 22 in a PMIC 24 is configured according to embodiments of the present disclosure to determine a relative group delay $\tau$ between a modulated voltage $V_{CC}$ and a modulated current $I_{PA}$ solely based on signals available in the PMIC 24. By determining the relative group delay $\tau$ inside the PMIC 24 based solely on the signals available in the PMIC 24, it is possible to eliminate the complexity associated with the conventional approach of determining the relative group delay $\tau$ in the existing communication circuit 10 of FIG. 1A. As a result, it is possible to drop the PMIC 24 into the communication circuit 20 to work with any power amplifier circuit of any vendor, such as the power amplifier circuit 12 in FIG. 1A.

In a non-limiting example, the communication circuit 20 includes a transceiver circuit 26 and the power amplifier circuit 12 in FIG. 1A. Notably, the power amplifier circuit 12 is provided herein to simply illustrate the fact that the PMIC 24 can operate with any power amplifier circuit of any vendor, including but not limited to the power amplifier circuit 12 in the existing communication circuit 10 of FIG. 1A.

The transceiver circuit 26 is configured to generate an RF signal 28 associated with a time-variant input power $P_{IN}$ and the power amplifier circuit 12 is configured to amplify the RF signal 28 from the time-variant input power to a time-variant output power $P_{OUT}$ based on the modulated voltage $V_{CC}$. As previously explained in FIG. 1A, the power amplifier circuit 12 can induce the modulated current $I_{P4}$ that can be misaligned from the modulated voltage $V_{CC}$ by the relative group delay $\tau$. Moreover, as illustrated in FIGS. 1B and 1C, the modulated voltage $V_{CC}$ can either lead or trail behind the modulated current $I_{P4}$ by the relative group delay $\tau$.

Given that the modulated current $I_{P4}$ is induced inside the power amplifier circuit 12, the PMIC 24 would therefore have no knowledge about the modulated current $I_{P4}$. In addition, the PMIC 24 may also have no direct knowledge about the modulated voltage $V_{CC}$ as received by the power amplifier circuit 12. As such, the group delay determination circuit 22 needs to estimate the relative group delay $\tau$ solely based on signals that are available in the PMIC 24.

In an embodiment, the group delay determination circuit 22 is configured to estimate the relative group delay $\tau$ based on at least an analog voltage signal 30 that is related to the modulated voltage $V_{CC}$ and an analog current signal 32 that is related to the modulated current $I_{P4}$. The analog voltage signal 30 and the analog current signal 32 are either generated inside the PMIC 24 or provided to the PMIC 24 from outside the PMIC 24. In this regard, the group delay determination circuit 22 is able to determine the relative group delay $\tau$ independent of the power amplifier circuit 12.

In an embodiment, the PMIC 24 includes a voltage modulation circuit 34 and a current modulation circuit 36. The voltage modulation circuit 34 includes a voltage amplifier 38, an offset capacitor $C_{OFF}$, and a bypass switch $S_{BYP}$. The voltage amplifier 38 is configured to generate a modulated initial voltage $V_{AMP}$ based on a modulated target voltage $V_{TGT}$, which is generated by the transceiver circuit 26 to track the time-variant input power $P_{IN}$ of the RF signal 28, and a supply voltage $V_{SUP}$.

The offset capacitor $C_{OFF}$ and the bypass switch $S_{BYP}$ are both coupled to an output 40 of the voltage amplifier 38. The offset capacitor $C_{OFF}$ is configured to raise the modulated initial voltage $V_{AMP}$ by an offset voltage $V_{OFF}$ to thereby generate the modulated voltage $V_{CC}$ ($V_{CC}=V_{AMP}+V_{OFF}$). In an embodiment, the offset voltage $V_{OFF}$ can be modulated by charging or discharging the offset capacitor $C_{OFF}$. For a specific example as to how the offset voltage $V_{OFF}$ can be modulated to raise the modulated initial voltage $V_{AMP}$ to the modulated voltage $V_{CC}$, please refer to U.S. patent application Ser. No. 17/946,224, entitled "MULTI-VOLTAGE GENERATION CIRCUIT" (hereinafter "Application 224").

Notably, while the offset capacitor $C_{OFF}$ is being charged or discharged toward the offset voltage $V_{OFF}$, which may be slow depending on the size of the offset capacitor $C_{OFF}$, the voltage modulation circuit 34 must maintain the modulated voltage $V_{CC}$ at a desired level. In this regard, the voltage amplifier 38 may source or sink a high-frequency current $I_{AMP}$ (e.g., an alternating current) to allow the load capacitor $C_{P4}$, which is much smaller than the offset capacitor $C_{OFF}$, to be quickly charged or discharged to maintain the modulated voltage $V_{CC}$. In this regard, the high-frequency current $I_{AMP}$ is similar to the modulated current $I_{P4}$ and can thus be utilized to represent the modulated current $I_{P4}$ in the power amplifier circuit 12.

In an embodiment, the voltage amplifier 38 may generate a sensed current $I_{SENSE}$ to proportionally represent the high-frequency current $I_{AMP}$. In a non-limiting example, the sensed current $I_{SENSE}$ is inversely related to the high-frequency current $I_{AMP}$ by a scaling factor k (k>100). As such, the sensed current $I_{SENSE}$ is smaller than the high-frequency current $I_{AMP}$.

On another hand, since the voltage modulation circuit 34 is configured to generate the modulated voltage $V_{CC}$ based on the modulated target voltage $V_{TGT}$, the modulated voltage $V_{CC}$ will be substantially similar to the modulated voltage $V_{TGT}$. Accordingly, the modulated target voltage $V_{TGT}$ can be utilized to represent the modulated voltage $V_{CC}$ as received at the power amplifier circuit 12.

In this regard, according to an embodiment of the present disclosure, the group delay determination circuit 22 is configured to receive the modulated target voltage $V_{TGT}$ as the analog voltage signal 30 and the sensed current $I_{SENSE}$ as the analog current signal 32. Accordingly, as described below in FIG. 3, the group delay determination circuit 22 is able to determine the relative group delay $\tau$ between the modulated voltage $V_{CC}$ and the modulated current $I_{P4}$ by determining the relative group delay $\tau$ between the modulated target voltage $V_{TGT}$ and the sensed current $I_{SENSE}$.

Figure 3:
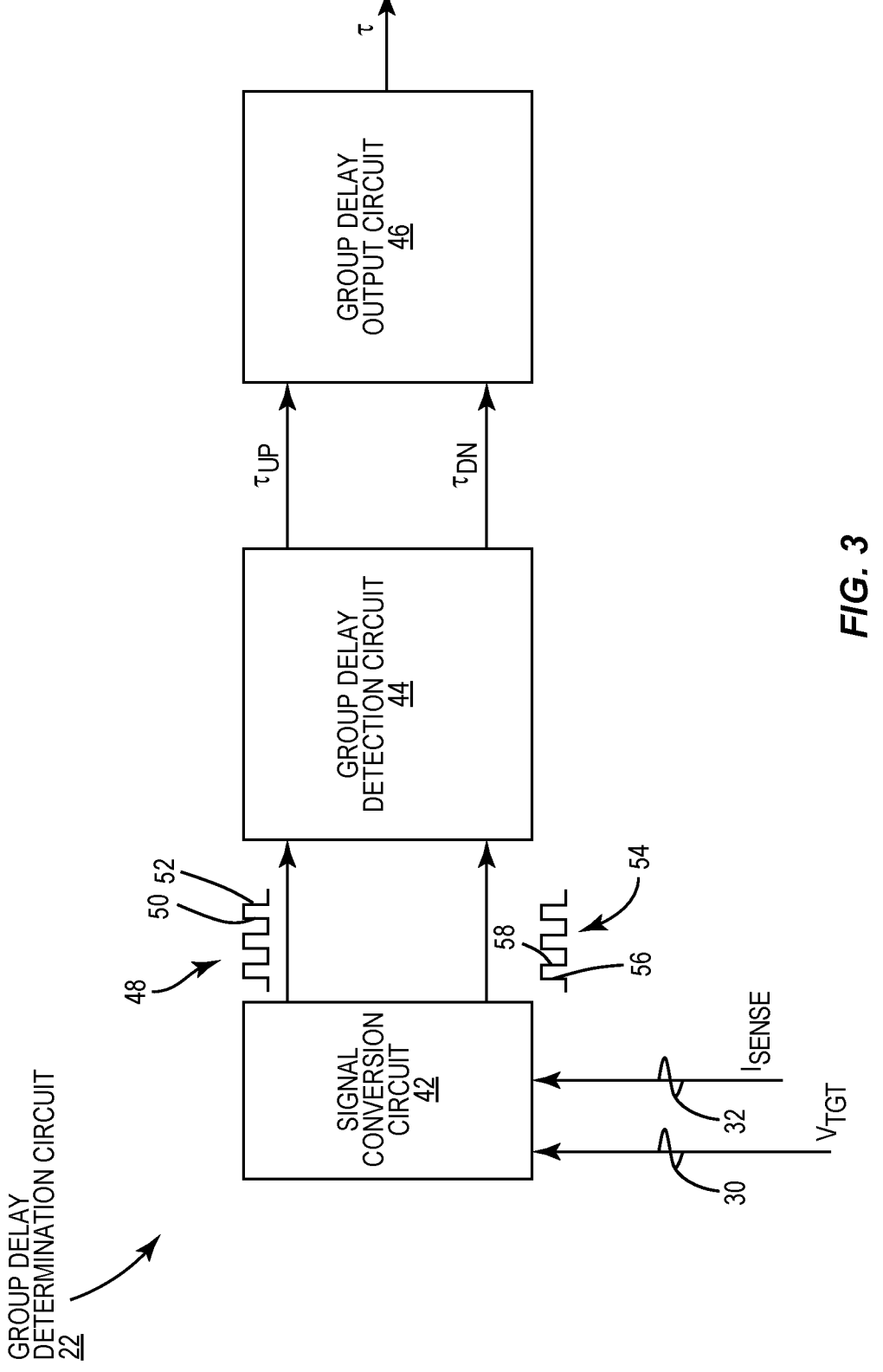
FIG. 3 is a schematic diagram providing an exemplary illustration of the group delay determination circuit in FIG. 2 that is configured according to an embodiment of the present disclosure.

FIG. 3 is a schematic diagram providing an exemplary illustration of the group delay determination circuit 22 in FIG. 2 according to an embodiment of the present disclosure. Common elements between FIGS. 2 and 3 are shown therein with common element numbers and will not be re-described herein.

Herein, the group delay determination circuit 22 includes a signal conversion circuit 42, a group delay detection circuit 44, and a group delay output circuit 46. The signal conversion circuit 42 receives the analog voltage signal 30 (e.g., the modulated target voltage $V_{TGT}$) and the analog current signal 32 (e.g., the sensed current $I_{SENSE}$). The signal conversion circuit 42 is configured to generate a rectangular current signal 48 (a.k.a. pulse signal), which includes multiple current rising edges 50 and multiple current falling edges 52, based on the analog voltage signal 30. The signal conversion circuit 42 is also configured to generate a rectangular voltage signal 54 (a.k.a. pulse signal), which includes multiple voltage rising edges 56 and multiple voltage falling edges 58, based on the received analog current signal 32 and the received analog voltage signal 30. For specific embodiments of the signal conversion circuit 42, please refer to U.S. patent application Ser. No. 17/960, 389, now U.S. Pat. No. 12,388,429, entitled "GROUP DELAY DETERMINATION IN A COMMUNICATION CIRCUIT."

Figure 4:
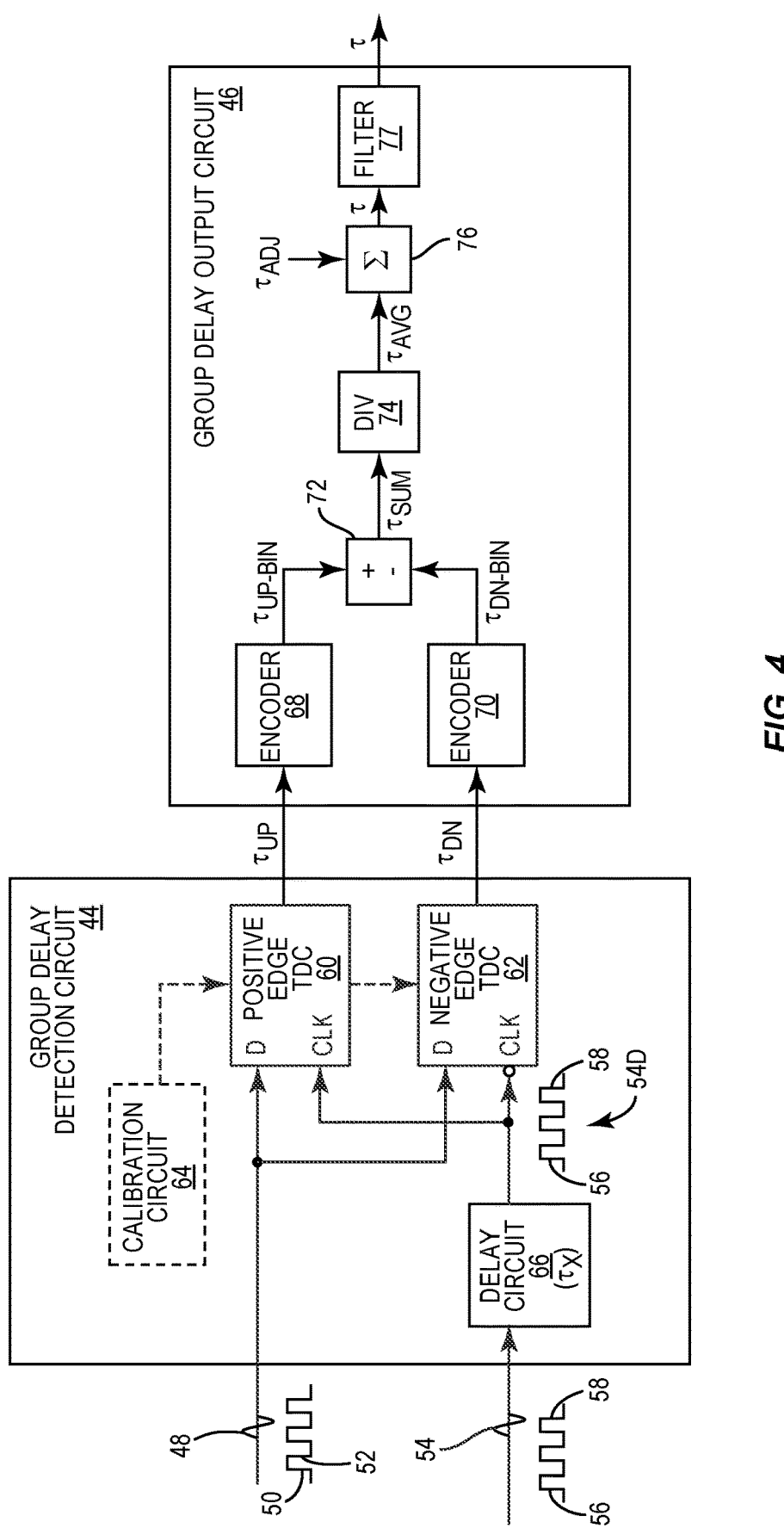
FIG. 4 is a schematic diagram illustrating a group delay detection circuit provided in the group delay determination circuit of FIG. 3 and configured according to one embodiment of the present disclosure.
Figure 6:
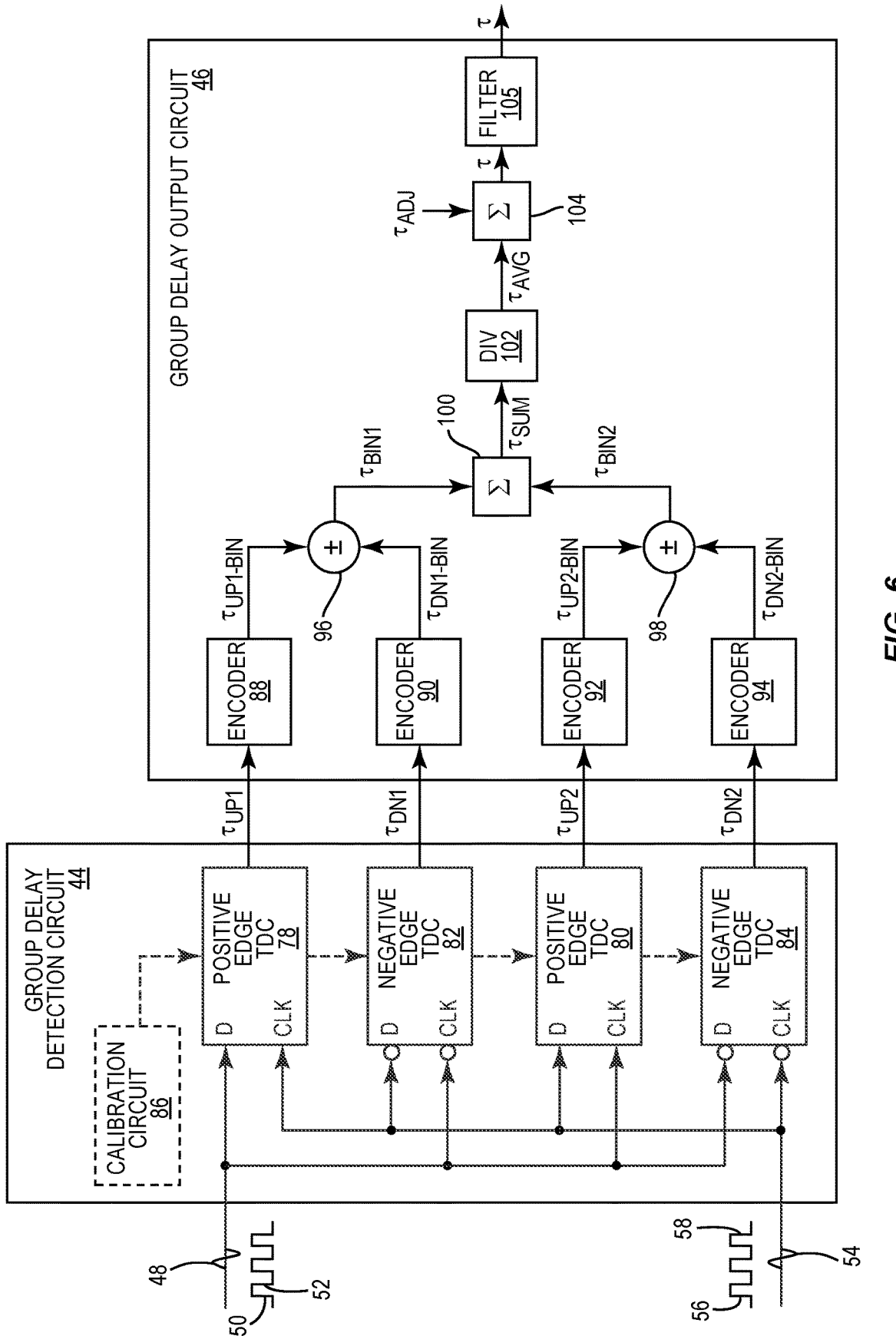
FIG. 6 is a schematic diagram illustrating a group delay detection circuit provided in the group delay determination circuit of FIG. 3 and configured according to another embodiment of the present disclosure.

As further described in FIGS. 4 and 6, the group delay detection circuit 44 is configured to determine a rising edge group delay $\tau_{UP}$ between a respective one of the current rising edges 50 and a respective one of the voltage rising edges 56, as well as a falling edge group delay $\tau_{DN}$ between a respective one of the current falling edges 52 and a respective one of the voltage falling edges 58. In a non-limiting example, the group delay detection circuit 44 can generate each of the rising edge group delay $\tau_{UP}$ and the falling edge group delay $\tau_{DN}$ as a thermometer encoded digital word. Accordingly, the group delay output circuit 46 is configured to determine the relative group delay $\tau$ between the modulated current $I_{P4}$ and the modulated voltage $V_{CC}$ based on the determined rising edge group delay $\tau_{UP}$ and the determined falling edge group delay $\tau_{DN}$.

FIG. 4 is a schematic diagram illustrating the group delay detection circuit 44 and the group delay output circuit 46 in the group delay determination circuit 22 of FIG. 3, which are configured according to one embodiment of the present disclosure. Common elements between FIGS. 3 and 4 are shown therein with common element numbers and will not be re-described herein.

Herein, the group delay detection circuit 44 includes a positive edge time-to-digital converter (TDC) 60 and a negative edge TDC 62. Each of the positive edge TDC 60 and the negative edge TDC 62 includes a respective data input (denoted as "D") and a clock input (denoted as "CLK"). The positive edge TDC 60 and the negative edge TDC 62 may receive a first selected one of the rectangular current signal 48 and the rectangular voltage signal 54 via the respective data input D and a second selected one of the rectangular current signal 48 and the rectangular voltage signal 54 via the clock input CLK.

In a non-limiting example, the positive edge TDC 60 and the negative edge TDC 62 are each configured to receive the rectangular current signal 48 at the data input D and the rectangular voltage signal 54 at the clock input CLK. In this regard, the rectangular current signal 48 becomes a data signal and the rectangular voltage signal 54 serves as a clock signal to latch the positive edge TDC 60 and the negative edge TDC 62. More specifically, the positive edge TDC 60 is latched by the voltage rising edges 56 of the rectangular voltage signal 54 to detect the current rising edges 50 of the rectangular current signal 48, while the negative edge TDC 62 is latched by the voltage falling edges 58 of the rectangular voltage signal 54 to detect the current falling edges 52 of the rectangular current signal 48. In an embodiment, each of the positive edge TDC 60 and the negative edge TDC 62 may be pre-calibrated via a calibration circuit 64.

Notably, in order to latch the current rising edges 50 of the rectangular current signal 48 using the voltage rising edges 56 of the rectangular voltage signal 54, the voltage rising edges 56 of the rectangular voltage signal 54 must be behind the current rising edges 50 of the rectangular current signal 48. Likewise, to latch the current falling edges 52 of the rectangular current signal 48 using the voltage falling edges 58 of the rectangular voltage signal 54, the voltage falling edges 58 of the rectangular voltage signal 54 must be behind the current falling edges 52 of the rectangular current signal 48. However, according to previous discussions in FIGS. 1B and 1C, the modulated voltage $V_{CC}$ can either lead or trail behind the modulated current $I_{P4}$ in the communication circuit 20. As a result, the rectangular voltage signal 54 can also lead or trail behind the rectangular current signal 48. As such, it is necessary to ensure that the voltage rising edges 56 of the rectangular voltage signal 54 always trail behind the current rising edges 50 of the rectangular current signal 48 and the voltage falling edges 58 of the rectangular voltage signal 54 always trail behind the current falling edges 52 of the rectangular current signal 48.

In this regard, the group delay detection circuit 44 is further configured to include a delay circuit 66 to introduce a predefined delay $\tau_X$ to the rectangular voltage signal 54, which serves as the clock signal in the example discussed herein. As further illustrated in FIGS. 5A and 5B, the delay circuit 66 is configured to delay the rectangular voltage signal 54 to generate a delayed rectangular voltage signal 54D, wherein each of the voltage rising edges 56 trails a respective one of the current rising edges 50 and each of the voltage falling edges 58 trails a respective one of the current falling edges 52. Accordingly, the delayed rectangular voltage signal 54D will serve as the clock signal of the positive edge TDC 60 and the negative edge TDC 62 to latch each of the current rising edges 50 and the current falling edges 52 of the rectangular current signal 48.

Figure 5A:
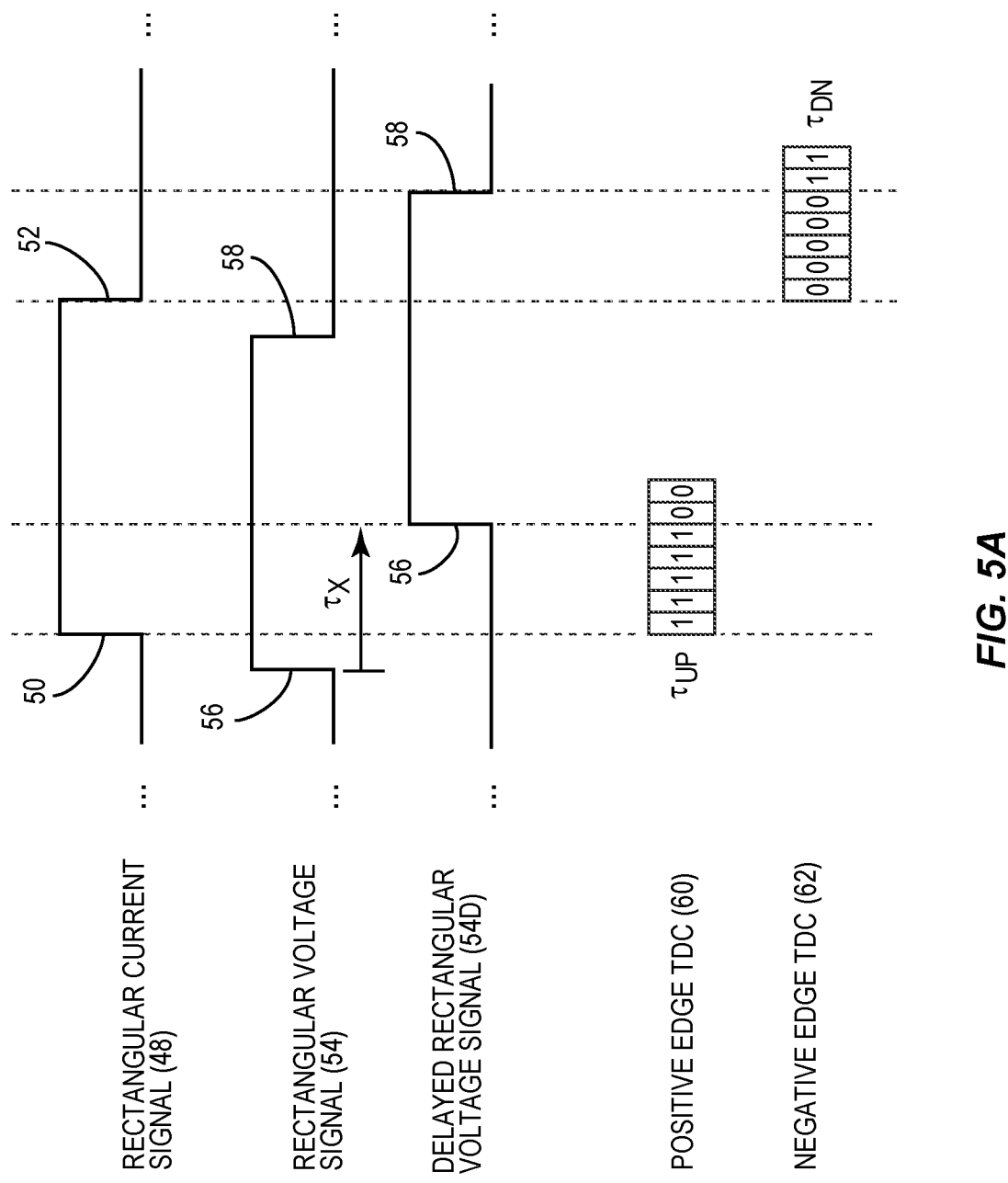
FIGS. 5A and 5B are graphic diagrams illustrating operations of the group delay detection circuit of FIG. 4.
Figure 5B:
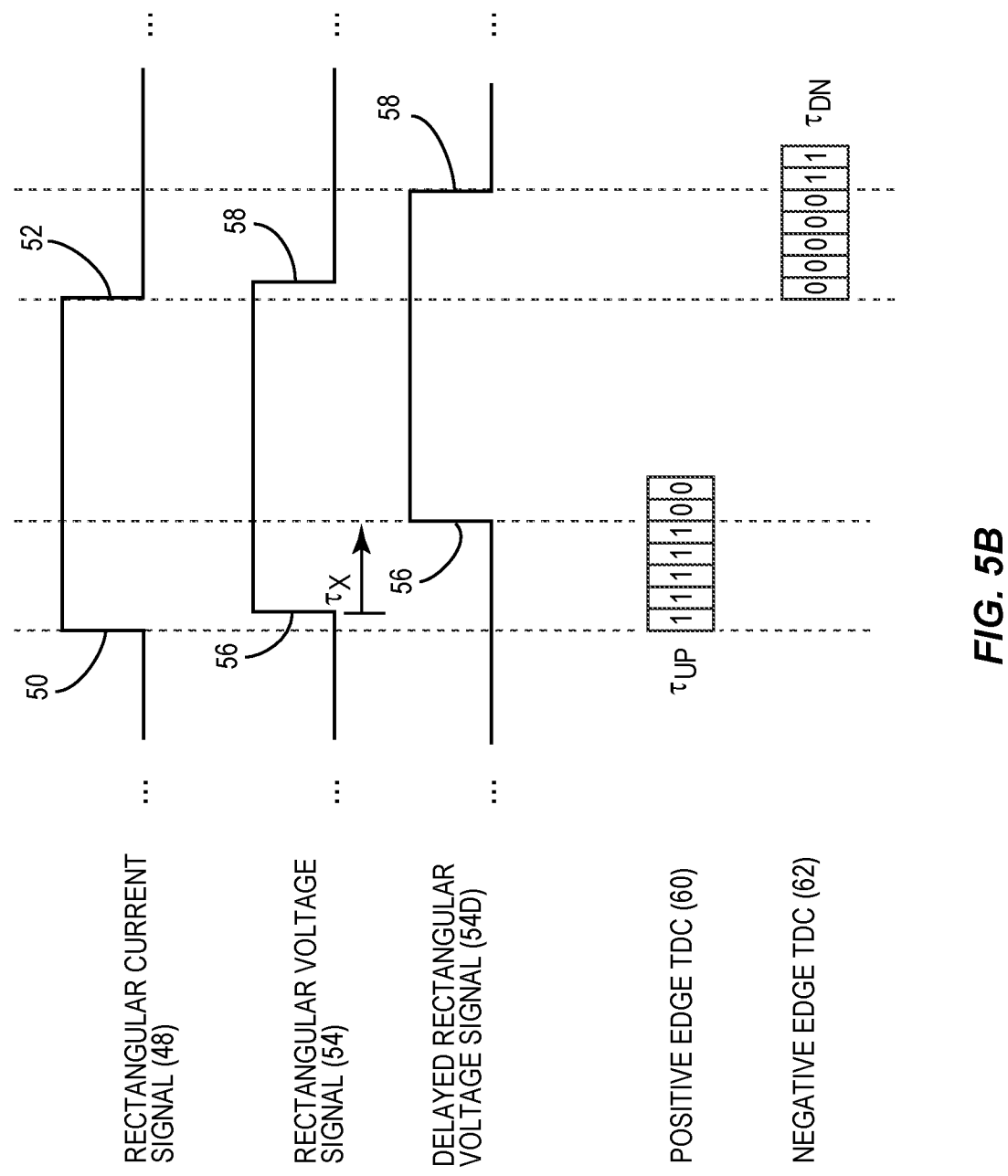

FIGS. 5A and 5B are graphic diagrams illustrating operations of the group delay detection circuit 44 of FIG. 4. Common elements between FIGS. 4 and 5A-5B are shown therein with common element numbers and will not be re-described herein.

FIG. 5A illustrates an example where the rectangular voltage signal 54 was previously leading the rectangular current signal 48. As shown in FIG. 5A, the delay circuit 66 adds the predefined delay $\tau_X$ to the rectangular voltage signal 54 to create the delayed rectangular voltage signal 54D, wherein the voltage rising edges 56 trail behind the current rising edges 50 and the voltage falling edges 58 trail behind the current falling edges 52. Thus, when the positive edge TDC 60 is latched by the voltage rising edges 56 of the delayed rectangular voltage signal 54D, the positive edge TDC 60 captures the rising edge group delay $\tau_{UP}$ (e.g., 1111100). Likewise, when the negative edge TDC 62 is latched by the voltage falling edges 58 of the delayed rectangular voltage signal 54D, the negative edge TDC 62 captures the falling edge group delay $\tau_{DN}$ (e.g., 0000011). In this regard, each of the rising edge group delay $\tau_{UP}$ (e.g., 1111100) and the falling edge group delay $\tau_{DN}$ (e.g., 0000011) is a thermometer encoded digital word.

FIG. 5B illustrates an example where the rectangular voltage signal 54 already trails behind the rectangular current signal 48. As shown in FIG. 5B, the delay circuit 66 adds the predefined delay $\tau_X$ to the rectangular voltage signal 54 to create the delayed rectangular voltage signal 54D, wherein the voltage rising edges 56 trail behind the current rising edges 50 and the voltage falling edges 58 trail behind the current falling edges 52. Thus, when the positive edge TDC 60 is latched by the voltage rising edges 56 of the delayed rectangular voltage signal 54D, the positive edge TDC 60 captures the rising edge group delay $\tau_{UP}$ (e.g., 1111100). Likewise, when the negative edge TDC 62 is latched by the voltage falling edges 58 of the delayed rectangular voltage signal 54D, the negative edge TDC 62 captures the falling edge group delay $\tau_{DN}$ (e.g., 0000011). In this regard, each of the rising edge group delay $\tau_{UP}$ (e.g., 1111100) and the falling edge group delay $\tau_{DN}$ (e.g., 0000011) is a thermometer encoded digital word.

Notably, since the rectangular voltage signal 54 already leads the rectangular current signal 48, it is actually not necessary to add the predefined delay $\tau_X$ to the rectangular voltage signal 54. However, since the rectangular voltage signal 54 can also lead the rectangular current signal 48, as illustrated in FIG. 5A, the delay circuit 66 is configured to always add the predefined delay $\tau_X$ to the rectangular voltage signal 54. In this regard, the predefined delay xx needs to be carefully determined to ensure that each of the voltage rising edges 56 will only latch a single one of the current rising edges 50 and each of the voltage falling edges 58 will only latch a single one of the current falling edges 52. Preferably, the predefined delay $\tau_X$ is shorter than one-half (½) of a minimum clock cycle of the rectangular current signal 48 (a.k.a. the data signal) and the rectangular voltage signal 54

(a.k.a. the clock signal). Herein, the clock cycle is not a clock cycle of a real clock signal. Instead, the clock cycle is defined by an inverse of a modulation bandwidth.

With reference back to FIG. 4, in an embodiment, the group delay output circuit 46 includes a first digital encoder 68, a second digital encoder 70, a first calculator 72, a divider 74, a second calculator 76, and a filter 77. The first digital encoder 68 is configured to encode the rising edge group delay $\tau_{UP}$ into a binary rising edge group delay $\tau_{UP\text{-}BIN}$. The second digital encoder 70 is configured to encode the falling edge group delay $\tau_{DN}$ into a binary falling edge group delay $\tau_{DN\text{-}BIN}$. The first calculator is configured to add the binary rising edge group delay $\tau_{UP\text{-}BIN}$ and the binary falling edge group delay $\tau_{DN\text{-}BIN}$ to generate a summed group delay $\tau_{SUM}$. The divider 74, which can be integrated with the first calculator 72 as opposed to being a standalone element, is configured to divide the summed group delay $\tau_{SUM}$ by two to generate an average group delay $\tau_{AVG}$. The second calculator 76 is configured to subtract the predefined delay $\tau_X$ from the average group delay $\tau_{AVG}$ and add an adjustment factor $\tau_{ADJ}$ to the average group delay $\tau_{AVG}$ to thereby determine the relative group delay $\tau$ between the modulated current $I_{P4}$ and the modulated voltage $V_{CC}$. The filter 77 may be configured to smooth out random variation with respect to modulated signals. Herein, the adjustment factor $\tau_{ADJ}$ can be so determined to accommodate for, as an example, the group delay associated with the signal conversion circuit 42 in the group delay determination circuit 22 of FIG. 3. In this regard, the relative group delay $\tau$ can thus be expressed as equation (Eq. 1) below.

$$\tau = \tfrac{1}{2}(\tau_{UP} - T_{DN}) - \tau_X + \tau_{ADJ} \qquad \text{(Eq. 1)}$$

FIG. 6 is a schematic diagram illustrating the group delay detection circuit 44 and the group delay output circuit 46 in the group delay determination circuit 22 of FIG. 3, which are configured according to an alternative embodiment of the present disclosure. Common elements between FIGS. 3 and 6 are shown therein with common element numbers and will not be re-described herein.

Different from the group delay detection circuit 44 in FIG. 4, the group delay detection circuit 44 discussed herein does not require the delay circuit 66. Instead, the group delay detection circuit 44 discussed herein includes a pair of positive edge TDCs, namely a first positive edge TDC 78 and a second positive edge TDC 80, as well as a pair of negative edge TDCs, namely a first negative edge TDC 82 and a second negative edge TDC 84. As described in detail below, the first positive edge TDC 78, the second positive edge TDC 80, the first negative edge TDC 82, and the second negative edge TDC 84 can ensure that the rising edge group delay $\tau_{UP}$ and the falling edge group delay $\tau_{DN}$ can always be detected, regardless of a relative timing offset (e.g., leading or trailing) and duty cycle (e.g., long or short) between the rectangular current signal 48 and the rectangular voltage signal 54. As such, the group delay detection circuit 44 can be provided in the communication circuit 20 of FIG. 3 to detect, in real time, the relative group delay $\tau$ between any modulated signals, including but not limited to the modulated current $I_{P4}$ and the modulated voltage $V_{CC}$.

Each of the first positive edge TDC 78, the second positive edge TDC 80, the first negative edge TDC 82, and the second negative edge TDC 84 includes a respective data input (denoted as "D") and a clock input (denoted as "CLK"). Each of the first positive edge TDC 78, the second positive edge TDC 80, the first negative edge TDC 82, and the second negative edge TDC 84 may be calibrated by a calibration circuit 86.

In a non-limiting example, the first positive edge TDC 78 receives a first one (e.g., the rectangular current signal 48) of the rectangular current signal 48 and the rectangular voltage signal 54 as a respective data signal via the data input D. The first positive edge TDC 78 also receives a second one (e.g., the rectangular voltage signal 54) of the rectangular current signal 48 and the rectangular voltage signal 54 as a respective clock signal via the clock input CLK.

In the same non-limiting example, the second positive edge TDC 80 receives the second one (e.g., the rectangular voltage signa 154) of the rectangular current signal 48 and the rectangular voltage signal 54 as a respective data signal via the data input D. The second positive edge TDC 80 also receives the first one (e.g., the rectangular current signal 48) of the rectangular current signal 48 and the rectangular voltage signal 54 as a respective clock signal via the clock input CLK.

In the same non-limiting example, the first negative edge TDC 82 receives the second one (e.g., the rectangular voltage signal 54) of the rectangular current signal 48 and the rectangular voltage signal 54 as a respective inverted data signal via the data input D. The first negative edge TDC 82 also receives the first one (e.g., the rectangular current signal 48) of the rectangular current signal 48 and the rectangular voltage signal 54 as a respective inverted clock signal via the clock input CLK.

In the same non-limiting example, the second negative edge TDC 84 receives the first one (e.g., the rectangular current signal 48) of the rectangular current signal 48 and the rectangular voltage signal 54 as a respective inverted data signal via the data input D. The second negative edge TDC 84 also receives the second one (e.g., the rectangular voltage signal 54) of the rectangular current signal 48 and the rectangular voltage signal 54 as a respective inverted clock signal via the clock input CLK.

Figure 7A:
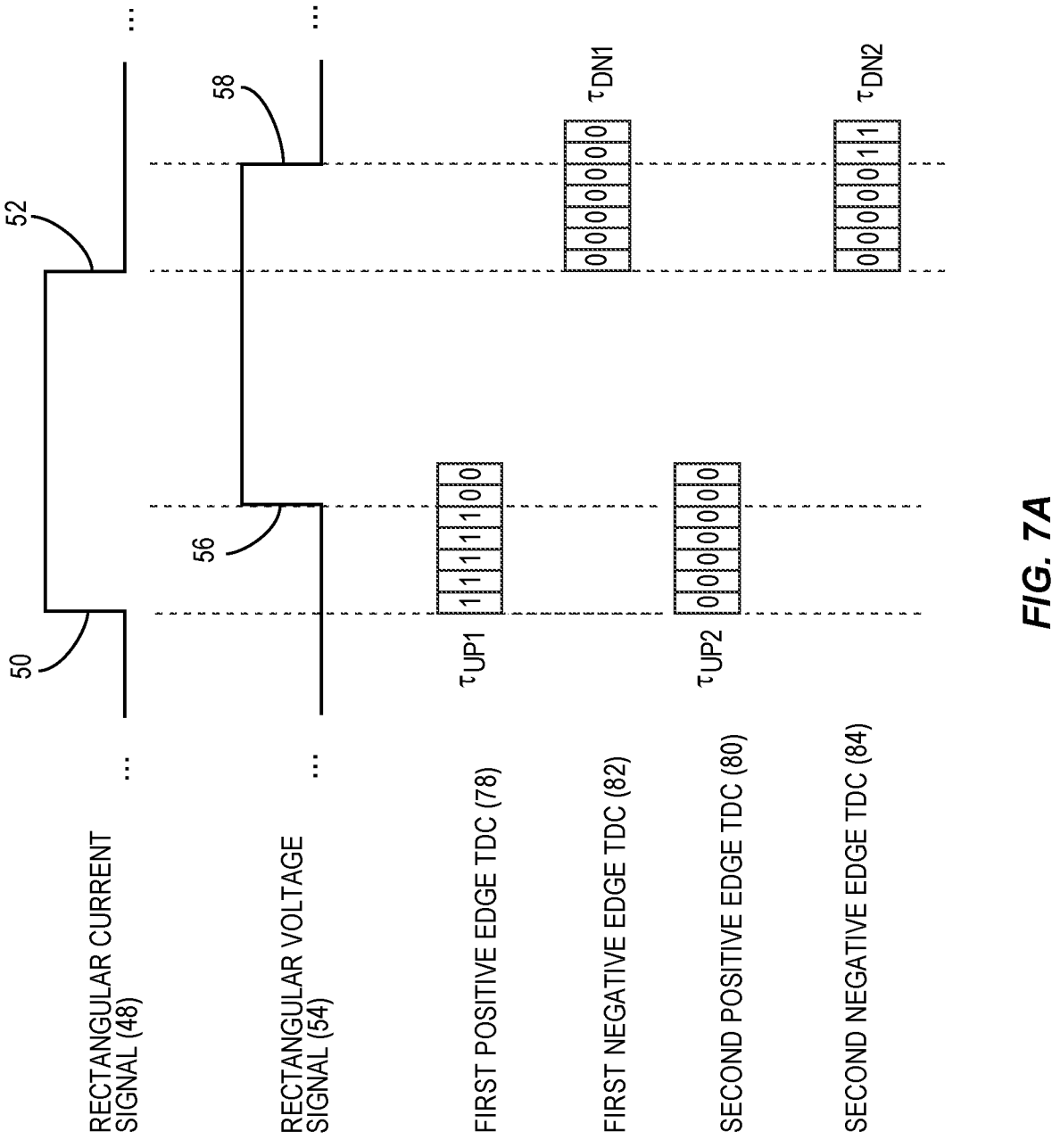
FIGS. 7A and 7B are graphic diagrams illustrating operations of the group delay detection circuit of FIG. 6.
Figure 7B:
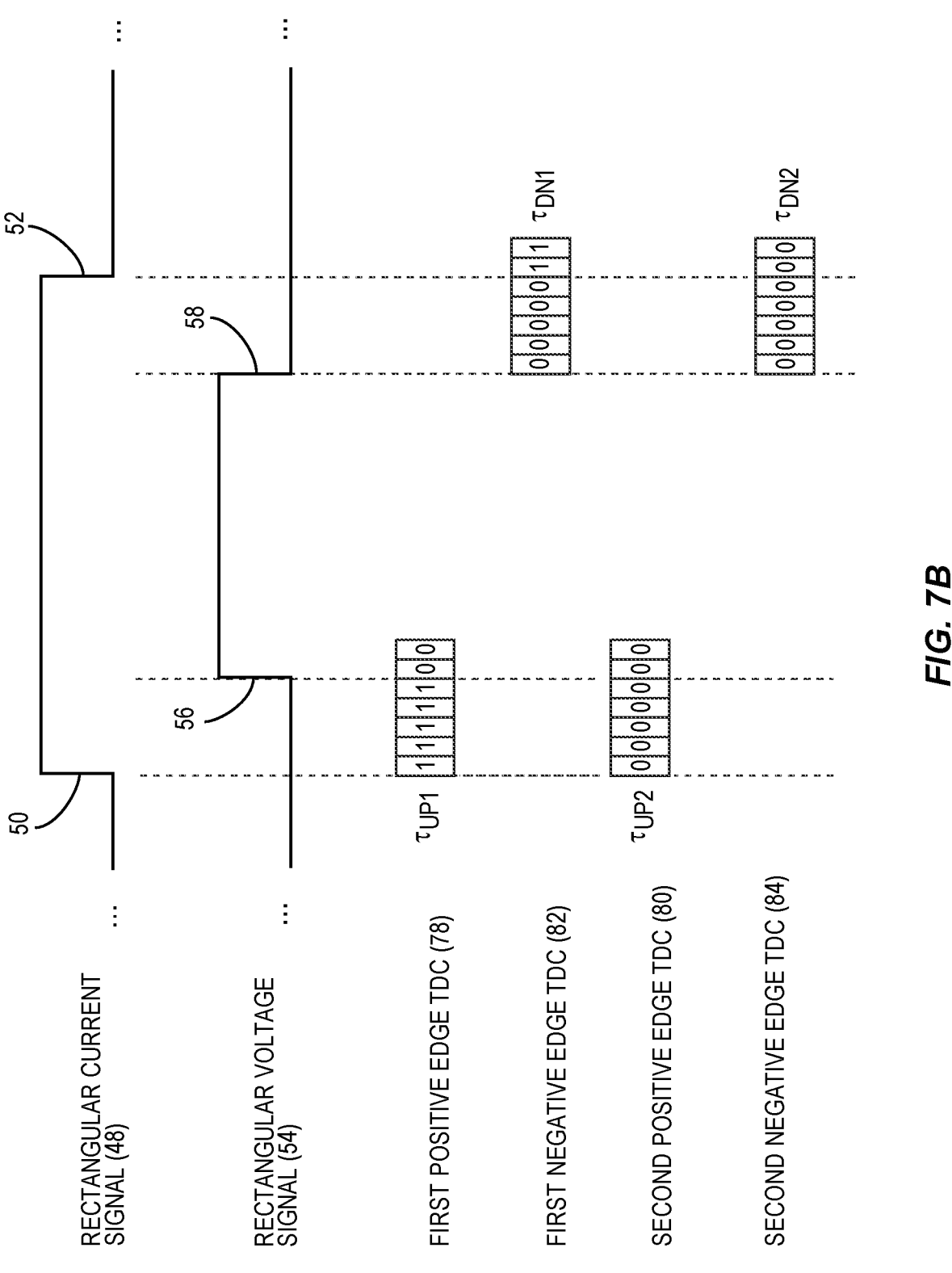

As described in the examples in FIGS. 7A and 7B, the first positive edge TDC 78 can detect a first rising edge group delay $\tau_{UP1}$ between the respective data signal (e.g., the rectangular current signal 48) and the respective clock signal (e.g., the rectangular voltage signal 54) and the second positive edge TDC 80 can detect a second rising edge group delay $\tau_{UP2}$ between the respective data signal (e.g., the rectangular voltage signal 54) and the respective clock signal (e.g., the rectangular current signal 48). Similarly, the first negative edge TDC 82 can detect a first falling edge group delay $\tau_{DN1}$ between the respective inverted data signal (e.g., inverted rectangular voltage signal 54) and the respective inverted clock signal (e.g., inverted rectangular current signal 48) and the second negative edge TDC 84 can detect a second falling edge group delay $\tau_{DN2}$ between the respective inverted data signal (e.g., inverted rectangular current signal 48) and the respective inverted clock signal (e.g., inverted rectangular voltage signal 54).

FIGS. 7A and 7B are graphic diagrams illustrating operations of the group delay detection circuit 44 of FIG. 6. Common elements between FIGS. 6 and 7A-7B are shown therein with common element numbers and will not be re-described herein.

FIG. 7A illustrates an example where the rectangular current signal 48 and the rectangular voltage signal 54 have similar duty cycles but different timing. In this example, the rectangular voltage signal 54 trails behind the rectangular current signal 48. As such, the first positive edge TDC 78, which is latched by the voltage rising edges 56 of the rectangular voltage signal 54, will capture the first rising edge group delay $\tau_{UP1}$ (e.g., 1111100). However, the second positive edge TDC 80, which is latched by the current rising edges 50 of the rectangular current signal 48, will not capture anything in the second rising edge group delay $\tau_{UP2}$ (e.g., 0000000). The first negative edge TDC 82, which is latched by the current falling edges 52 of the rectangular current signal 48, will not capture anything in the first falling edge group delay $\tau_{DN1}$ (e.g., 0000000). However, the second negative edge TDC 84, which is latched by the voltage falling edges 58 of the rectangular voltage signal 54, will capture the second falling edge group delay $\tau_{DN2}$ (e.g., 0000011). Herein, each of the first rising edge group delay $\tau_{UP1}$, the second rising edge group delay $\tau_{UP2}$, the first falling edge group delay $\tau_{DN1}$, and the second falling edge group delay $\tau_{DN2}$ can be represented by a respective thermometer encoded digital word.

As can be seen in FIG. 7A, the group delay detection circuit 44 in FIG. 6 can always capture one of the first rising edge group delay $\tau_{UP1}$ and the second rising edge group delay $\tau_{UP2}$ as well as one of the first falling edge group delay $\tau_{DN1}$ and the second falling edge group delay $\tau_{DN2}$. Although FIG. 7A illustrates a scenario where the rectangular voltage signal 54 trails the rectangular current signal 48, it should be appreciated that the same conclusion holds true when the rectangular voltage signal 54 leads the rectangular current signal 48.

FIG. 7B illustrates an example where the rectangular current signal 48 and the rectangular voltage signal 54 have different duty cycles and different timing. In this example, the rectangular voltage signal 54 has a shorter duty cycle that the rectangular current signal 48.

As such, the first positive edge TDC 78, which is latched by the voltage rising edges 56 of the rectangular voltage signal 54, will capture the first rising edge group delay $\tau_{UP1}$ (e.g., 1111100). However, the second positive edge TDC 80, which is latched by the current rising edges 50 of the rectangular current signal 48, will not capture anything in the second rising edge group delay $\tau_{UP2}$ (e.g., 0000000). The first negative edge TDC 82, which is latched by the current falling edges 52 of the rectangular current signal 48, will not capture the first falling edge group delay $\tau_{DN1}$ (e.g., 0000011). However, the second negative edge TDC 84, which is latched by the voltage falling edges 58 of the rectangular voltage signal 54, will not capture anything in the second falling edge group delay $\tau_{DN2}$ (e.g., 0000000). Herein, each of the first rising edge group delay $\tau_{UP1}$, the second rising edge group delay $\tau_{UP2}$, the first falling edge group delay $\tau_{DN1}$, and the second falling edge group delay $\tau_{DN2}$ can be represented by a respective thermometer encoded digital word.

As can be seen in FIG. 7B, the group delay detection circuit 44 in FIG. 6 can always capture one of the first rising edge group delay $\tau_{UP1}$ and the second rising edge group delay $\tau_{UP2}$ as well as one of the first falling edge group delay $\tau_{DN1}$ and the second falling edge group delay $\tau_{DN2}$. Although FIG. 7B illustrates a scenario where the rectangular voltage signal 54 has a shorter duty cycle than the rectangular current signal 48, it should be appreciated that the same conclusion holds true when the rectangular voltage signal 54 has a longer duty cycle than the rectangular current signal 48.

With reference back to FIG. 6, in an embodiment, the group delay output circuit 46 includes a first digital encoder 88, a second digital encoder 90, a third digital encoder 92, a fourth digital encoder 94, a first combiner 96, a second combiner 98, a first calculator 100, a divider 102, a second calculator 104, and a filter 105. The first digital encoder 88 is configured to encode the first rising edge group delay $\tau_{UP1}$ into a first binary rising edge group delay $\tau_{UP1\text{-}BIN}$. The second digital encoder 90 is configured to encode the first falling edge group delay $\tau_{DN1}$ into a first binary falling edge group delay $\tau_{DN1\text{-}BIN}$. The third digital encoder 92 is configured to encode the second rising edge group delay $\tau_{UP2}$ into a second binary rising edge group delay $\tau_{UP2\text{-}BIN}$. The fourth digital encoder 94 is configured to encode the second falling edge group delay $\tau_{DN2}$ into a second binary falling edge group delay $\tau_{DN2\text{-}BIN}$.

The first combiner 96 is configured to combine the first binary rising edge group delay $\tau_{UP1\text{-}BIN}$ and the first binary falling edge group delay $\tau_{DN1\text{-}BIN}$ to generate a first binary group delay $\tau_{BIN1}$. The second combiner 98 is configured to combine the second binary rising edge group delay $\tau_{UP2\text{-}BIN}$ and the second binary falling edge group delay $\tau_{DN2\text{-}BIN}$ to generate a second binary group delay $\tau_{BIN2}$. The first calculator 100 is configured to add the first binary group delay $\tau_{BIN1}$ and the second binary group delay $\tau_{BIN2}$ to generate a summed group delay $\tau_{SUM}$. The divider 102, which may be integrated with the first calculator 100 as opposed to being a standalone element, is configured to divide the summed group delay $\tau_{SUM}$ by two to generate an average group delay $\tau_{AVG}$. The second calculator 104 is configured to add an adjustment factor $\tau_{ADJ}$ to the average group delay $\tau_{AVG}$ to thereby determine the relative group delay $\tau$ between the modulated current $I_{P4}$ and the modulated voltage $V_{CC}$. The filter 105 may be configured to smooth out random variation with respect to modulated signals. Herein, the adjustment factor $\tau_{ADJ}$ can be so determined to accommodate for, as an example, the group delay associated with the signal conversion circuit 42 in the group delay determination circuit 22 of FIG. 3. In this regard, the relative group delay $\tau$ can thus be expressed as equation (Eq. 2) below.

$$\tau = \tfrac{1}{2}(\tau_{UP1} + \tau_{UP2} - \tau_{DN1} - \tau_{DN2}) + \tau_{ADJ} \qquad \text{(Eq. 2)}$$

Figure 8:
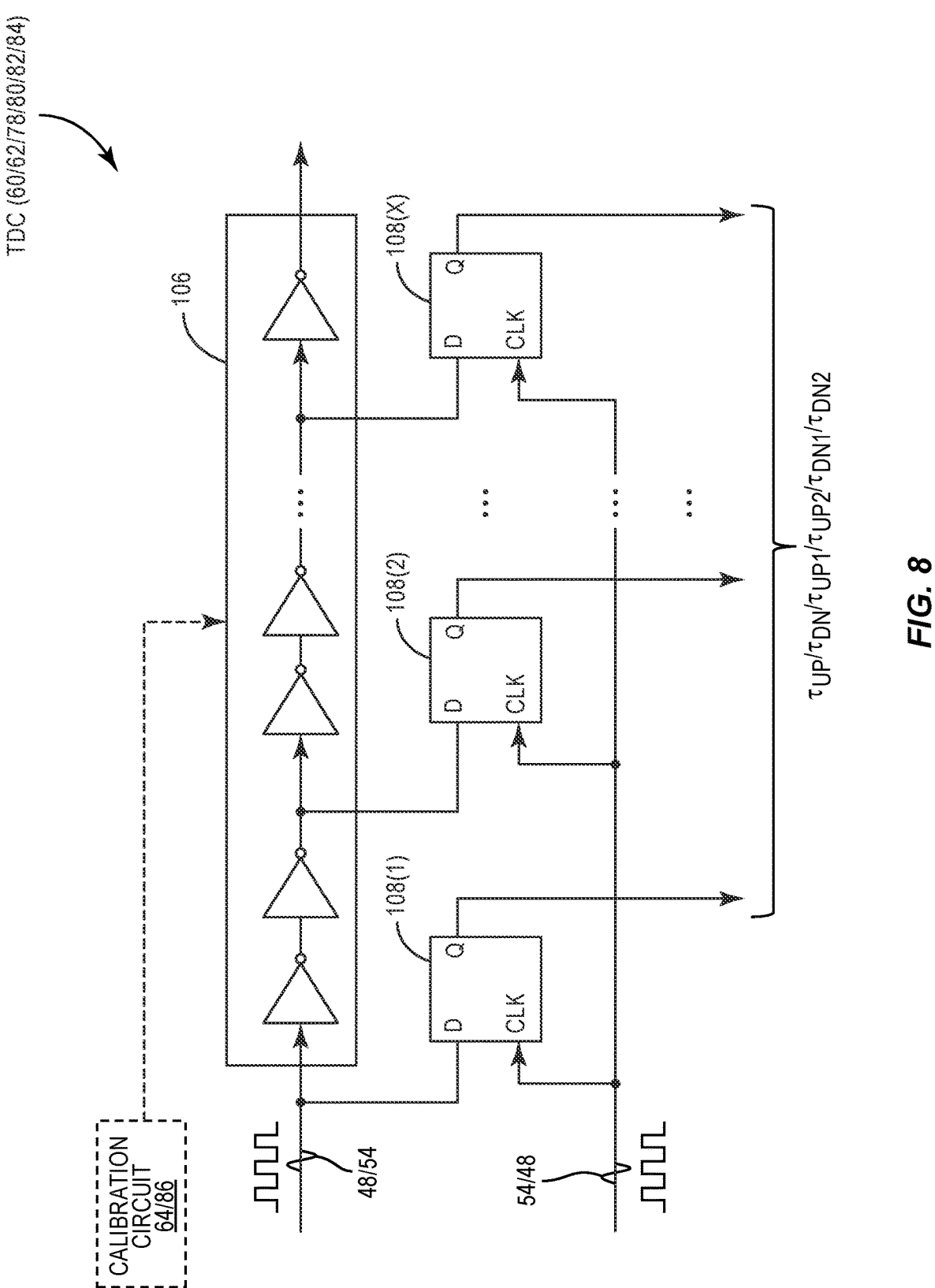
FIG. 8 is a schematic diagram illustrating a time-to-digital converter (TDC) that can be provided in any of the group detection circuits of FIGS. 4 and 6.

FIG. 8 is a schematic diagram illustrating an embodiment of the positive edge TDC 60, the negative edge TDC 62, the first positive edge TDC 78, the second positive edge TDC 80, the first negative edge TDC 82, and the second negative edge TDC 84 in FIGS. 4 and 6. Common elements between FIGS. 4, 6, and 8 are shown therein with common element numbers and will not be re-described herein.

Herein, each of the positive edge TDC 60, the negative edge TDC 62, the first positive edge TDC 78, the second positive edge TDC 80, the first negative edge TDC 82, and the second negative edge TDC 84 includes a delay line 106 and multiple digital flip-flops 108(1)-108(X). The delay line 106 may be calibrated by the calibration circuit 64 in FIG. 4 and/or the calibration circuit 86 in FIG. 6. The number of the digital flip-flops 108(1)-108(X) determines the number of bits in the rising edge group delay $\tau_{UP}$, the falling edge group delay $\tau_{DN}$, the first rising edge group delay $\tau_{UP1}$, the second rising edge group delay $\tau_{UP2}$, the first falling edge group delay $\tau_{DN1}$, and the second falling edge group delay $\tau_{DN2}$.

Figure 9:
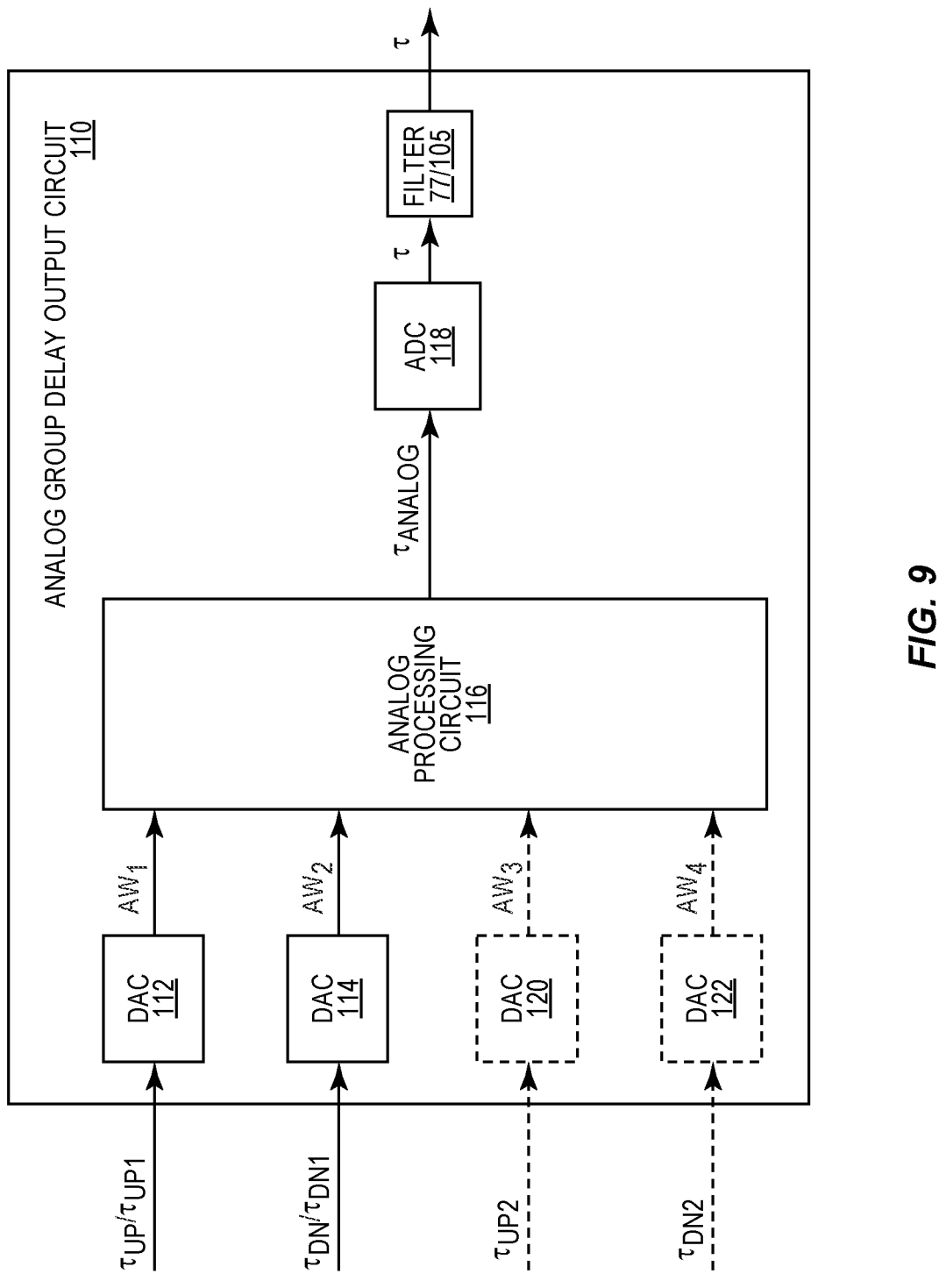
FIG. 9 is a schematic diagram illustrating a group delay output circuit provided in the group delay determination circuit of FIG. 3 and configured according to various embodiments of the present disclosure.

Notably, the group delay output circuit 46 in FIGS. 4 and 6 are each configured to determine the relative group delay $\tau$ in digital domain. In a non-limiting example, the group delay output circuit 46 in FIGS. 4 and 6 can also be configured to determine the relative group delay $\tau$ in an analog domain. In this regard, FIG. 9 is a schematic diagram of an exemplary analog group delay output circuit 110, configured according to an embodiment of the present disclosure.

Herein, the analog group delay output circuit 110 includes a first digital-to-analog converter (DAC) 112, a second DAC 114, an analog processing circuit 116, and an analog-todigital converter (ADC) 118. When operating as the group delay output circuit 46 in FIG. 6, the analog group delay output circuit 110 may also include a third DAC 120 and a fourth DAC 122.

The first DAC 112 is configured to convert each bit in the rising edge group delay $\tau_{UP}$ or the first rising edge group delay $\tau_{UP1}$ into a respective analog word $AW_1$. The second DAC 114 is configured to convert each bit in the falling edge group delay $\tau_{DN}$ or the first falling edge group delay $\tau_{DN1}$ into a respective analog word $AW_2$. The third DAC 120, when employed, is configured to convert each bit in the second rising edge group delay $\tau_{UP2}$ into a respective analog word $AW_3$. The fourth DAC 122, when employed, is configured to convert each bit in the second falling edge group delay $\tau_{DN2}$ into a respective analog word $AW_4$.

The analog processing circuit 116 is configured to process the analog words $AW_1$, $AW_2$, $AW_3$, $AW_4$ in the analog domain to generate an analog group delay $\tau_{ANALOG}$. The ADC 118 is configured to convert the analog group delay $\tau_{ANALOG}$ into the group delay $\tau$.

With reference back to FIG. 2, the current modulation circuit 36 includes a multi-level charge pump (MCP) 124 and a power inductor 126. The MCP 124, which can be a buck-boost direct-current (DC) to DC (DC-DC) converter, is configured to generate a low-frequency voltage $V_{DC}$ (e.g., a DC voltage) as a function of a battery voltage $V_{BAT}$. Specifically, the MCP 124 may operate in a buck mode to generate the low-frequency voltage $V_{DC}$ at $0 \times V_{BAT}$ (0 V) or $1 \times V_{BAT}$, or in a boost mode to generate the low-frequency voltage $V_{DC}$ at $2 \times V_{BAT}$. In addition, the MCP 124 may toggle between $0 \times V_{BAT}$ (0 V), $1 \times V_{BAT}$, and/or $2 \times V_{BAT}$ based on a duty cycle 128 to thereby generate the low-frequency voltage $V_{DC}$ at a desired voltage level. In a non-limiting example, the current modulation circuit 36 can include a controller 130 (e.g., a microcontroller or a microprocessor) that determines the duty cycle 128 based on the modulated target voltage $V_{TGT}$.

The power inductor 126 is configured to induce a low-frequency current $I_{DC}$ based on the low-frequency voltage $V_{DC}$. In an embodiment and as further described in Application 244, the low-frequency current $I_{DC}$ is configured to modulate the offset voltage $V_{OFF}$ across the offset capacitor $C_{OFF}$.

The communication circuit 20 of FIG. 2 can be configured to support group delay determination as described above based on a process. In this regard, FIG. 10 is a flowchart of an exemplary process 200 determining the group delay $\tau$ in the communication circuit 20 of FIG. 2.

Herein, the group delay detection circuit 44 in FIGS. 4 and 6 receives the rectangular current signal 48, which is related to the modulated current $I_{P4}$ and includes the current rising edges 50 and the current falling edges 52 (step 202). The group delay detection circuit 44 in FIGS. 4 and 6 also receives the rectangular voltage signal 54, which is related to the modulated voltage $V_{CC}$ and includes the voltage rising edges 55 and the voltage falling edges 58 (step 204).

The group delay detection circuit 44 is configured to determine the rising edge group delay $\tau_{UP}$ in FIG. 4 or either one of the first rising edge group delay $\tau_{UP1}$ or the second rising edge group delay $\tau_{UP2}$ in FIG. 6 between a respective one of the current rising edges 50 and a respective one of the voltage rising edges 56 (step 206). The group delay detection circuit 44 is also configured to determine the falling edge group delay $\tau_{DN}$ in FIG. 4 or either one of the first falling edge group delay $\tau_{DN1}$ or the second falling edge group delay $\tau_{DN2}$ in FIG. 6 between a respective one of the current falling edges 52 and a respective one of the voltage falling edges 58 (step 208). Accordingly, the group delay detection circuit 44 can determine the relative group delay $\tau$ between the modulated voltage $V_{CC}$ and the modulated current $I_{P4}$ based on the determined rising edge group delay $\tau_{UP}$ in FIG. 4 or either one of the first rising edge group delay $\tau_{UP1}$ or the second rising edge group delay $\tau_{UP2}$ in FIG. 6 and the falling edge group delay $\tau_{DN}$ in FIG. 4 or either one of the first falling edge group delay $\tau_{DN1}$ or the second falling edge group delay $\tau_{DN2}$ in FIG. 6 (step 210).

Those skilled in the art will recognize improvements and modifications to the embodiments of the present disclosure. All such improvements and modifications are considered within the scope of the concepts disclosed herein and the claims that follow.

What is claimed is:

1. A group delay determination circuit comprising:
   a group delay detection circuit configured to:
      receive a rectangular current signal related to a modulated current, wherein the rectangular current signal comprises a plurality of current rising edges and a plurality of current falling edges;
      receive a rectangular voltage signal related to a modulated voltage, wherein the rectangular voltage signal comprises a plurality of voltage rising edges and a plurality of voltage falling edges;
      determine a rising edge group delay between a respective one of the plurality of current rising edges and a respective one of the plurality of voltage rising edges; and
      determine a falling edge group delay between a respective one of the plurality of current falling edges and a respective one of the plurality of voltage falling edges; and
   a group delay output circuit configured to determine a relative group delay between the modulated current and the modulated voltage based on the determined rising edge group delay and the determined falling edge group delay.

2. The group delay determination circuit of claim 1, further comprising a signal conversion circuit configured to:
   receive an analog voltage signal related to the modulated voltage and an analog current signal related to the modulated current;
   generate the rectangular voltage signal comprising the plurality of voltage rising edges and the plurality of voltage falling edges based on the received analog voltage signal;
   generate the rectangular current signal comprising the plurality of current rising edges and the plurality of current falling edges based on the received analog current signal and the received analog voltage signal; and
   provide the rectangular current signal and the rectangular voltage signal to the group delay detection circuit.

3. The group delay determination circuit of claim 1, wherein the group delay detection circuit comprises a positive edge time-to-digital converter (TDC) and a negative edge TDC each configured to:
   receive a first selected one of the rectangular current signal and the rectangular voltage signal as a data signal; and
   receive a second selected one of the rectangular current signal and the rectangular voltage signal as a clock signal;
   wherein the positive edge TDC is further configured to detect the rising edge group delay between the data signal and the clock signal and the negative edge TDC is further configured to detect the falling edge group delay between the data signal and the clock signal.

4. The group delay determination circuit of claim 3, wherein the group delay detection circuit further comprises a delay circuit configured to delay the clock signal by a predefined delay that is shorter than one-half of a minimum clock cycle of the data signal and the clock signal.

5. The group delay determination circuit of claim 4, wherein the group delay output circuit comprises:
   a first digital encoder configured to encode the rising edge group delay into a binary rising edge group delay;
   a second digital encoder configured to encode the falling edge group delay into a binary falling edge group delay;
   a first calculator configured to add the binary rising edge group delay and the binary falling edge group delay to generate a summed group delay;
   a divider configured to divide the summed group delay by two to generate an average group delay; and
   a second calculator configured to subtract the predefined delay from the average group delay and add an adjustment factor to the average group delay to thereby determine the relative group delay between the modulated current and the modulated voltage.

6. The group delay determination circuit of claim 3, wherein the positive edge TDC and the negative edge TDC are each configured to generate a respective one of the rising edge group delay and the falling edge group delay as a thermometer encoded digital word.

7. The group delay determination circuit of claim 1, wherein the group delay detection circuit comprises:
   a first positive edge time-to-digital converter (TDC) configured to:
      receive a first one of the rectangular current signal and the rectangular voltage signal as a data signal;
      receive a second one of the rectangular current signal and the rectangular voltage signal as a clock signal; and
      detect a first rising edge group delay between the data signal and the clock signal;
   a first negative edge TDC configured to:
      receive the second one of the rectangular current signal and the rectangular voltage signal as an inverted data signal;
      receive the first one of the rectangular current signal and the rectangular voltage signal as an inverted clock signal; and
      detect a first falling edge group delay between the inverted data signal and the inverted clock signal;
   a second positive edge TDC configured to:
      receive the second one of the rectangular current signal and the rectangular voltage signal as the data signal;
      receive the first one of the rectangular current signal and the rectangular voltage signal as the clock signal; and
      detect a second rising edge group delay between the data signal and the clock signal; and
   a second negative edge TDC configured to:
      receive the first one of the rectangular current signal and the rectangular voltage signal as the inverted data signal;
      receive the second one of the rectangular current signal and the rectangular voltage signal as the inverted clock signal; and
      detect a second falling edge group delay between the inverted data signal and the inverted clock signal.

8. The group delay determination circuit of claim 7, wherein the group delay output circuit comprises:
   a first digital encoder configured to encode the first rising edge group delay into a first binary rising edge group delay;
   a second digital encoder configured to encode the first falling edge group delay into a first binary falling edge group delay;
   a third digital encoder configured to encode the second rising edge group delay into a second binary rising edge group delay;
   a fourth digital encoder configured to encode the second falling edge group delay into a second binary falling edge group delay;
   a first combiner configured to combine the first binary rising edge group delay and the first binary falling edge group delay to generate a first binary group delay;
   a second combiner configured to combine the second binary rising edge group delay and the second binary falling edge group delay to generate a second binary group delay;
   a first calculator configured to add the first binary group delay and the second binary group delay to generate a summed group delay;
   a divider configured to divide the summed group delay by two to generate an average group delay; and
   a second calculator configured to add an adjustment factor to the average group delay to thereby determine the relative group delay between the modulated current and the modulated voltage.

9. The group delay determination circuit of claim 7, wherein the first positive edge TDC, the first negative edge TDC, the second positive edge TDC, and the second negative edge TDC are each configured to generate a respective one of the first rising edge group delay, the first falling edge group delay, the second rising edge group delay, and the second falling edge group delay as a thermometer encoded digital word.

10. A communication circuit comprising:
   a power amplifier circuit configured to amplify a radio frequency (RF) signal associated with a time-variant input power based on a modulated voltage and induce a modulated current that tracks the time-variant input power of the RF signal; and
   a power amplifier integrated circuit (PMIC) comprising:
      a voltage modulation circuit configured to generate the modulated voltage based on a modulated target voltage; and
      a group delay determination circuit comprising:
      a group delay detection circuit configured to:
      receive a rectangular current signal related to the modulated current, wherein the rectangular current signal comprises a plurality of current rising edges and a plurality of current falling edges;
      receive a rectangular voltage signal related to the modulated voltage, wherein the rectangular voltage signal comprises a plurality of voltage rising edges and a plurality of voltage falling edges;
      determine a rising edge group delay between a respective one of the plurality of current rising edges and a respective one of the plurality of voltage rising edges; and
      determine a falling edge group delay between a respective one of the plurality of current falling edges and a respective one of the plurality of voltage falling edges; and a group delay output circuit configured to determine a relative group delay between the modulated current and the modulated voltage based on the determined rising edge group delay and the determined falling edge group delay.

11. The communication circuit of claim 10, wherein the group delay determination circuit further comprises a signal conversion circuit configured to:

receive an analog voltage signal related to the modulated voltage and an analog current signal related to the modulated current;

generate the rectangular voltage signal comprising the plurality of voltage rising edges and the plurality of voltage falling edges based on the received analog voltage signal;

generate the rectangular current signal comprising the plurality of current rising edges and the plurality of current falling edges based on the received analog current signal and the received analog voltage signal; and provide the rectangular current signal and the rectangular voltage signal to the group delay detection circuit.

12. The communication circuit of claim 11, further comprising a transceiver circuit configured to:

generate the RF signal associated with the time-variant input power;

generate the modulated target voltage that tracks the time-variant input power of the RF signal;

receive the determined relative group delay between the modulated voltage and the modulated current; and delay the RF signal by the determined relative group delay to thereby time align the modulated voltage and the modulated current at the power amplifier circuit.

13. The communication circuit of claim 11, wherein the voltage modulation circuit comprises:

a voltage amplifier configured to:

generate a modulated initial voltage based on the modulated target voltage;

cause a high-frequency current between the voltage amplifier and the power amplifier circuit; and generate a sensed current proportionally related to the high-frequency current; and an offset capacitor configured to raise the modulated initial voltage by an offset voltage modulated by a low-frequency current to thereby generate the modulated voltage.

14. The communication circuit of claim 13, wherein the PMIC further comprises a current modulation circuit configured to generate the low-frequency current based on the modulated target voltage and as a function of a battery voltage.

15. The communication circuit of claim 13, wherein the group delay determination circuit is further configured to:

receive the modulated target voltage as the analog voltage signal; and receive the sensed current as the analog current signal.

16. A method for determining a group delay in a communication circuit, the method comprising:

receiving a rectangular current signal related to a modulated current, wherein the rectangular current signal comprises a plurality of current rising edges and a plurality of current falling edges;

receiving a rectangular voltage signal related to a modulated voltage, wherein the rectangular voltage signal comprises a plurality of voltage rising edges and a plurality of voltage falling edges;

determining a rising edge group delay between a respective one of the plurality of current rising edges and a respective one of the plurality of voltage rising edges;

determining a falling edge group delay between a respective one of the plurality of current falling edges and a respective one of the plurality of voltage falling edges; and determining a relative group delay between the modulated current and the modulated voltage based on the determined rising edge group delay and the determined falling edge group delay.

17. The method of claim 16, further comprising:

receiving an analog voltage signal related to the modulated voltage and an analog current signal related to the modulated current;

generating the rectangular voltage signal comprising the plurality of voltage rising edges and the plurality of voltage falling edges based on the received analog voltage signal; and generating the rectangular current signal comprising the plurality of current rising edges and the plurality of current falling edges based on the received analog current signal and the received analog voltage signal.

18. The method of claim 16, further comprising:

receiving a first selected one of the rectangular current signal and the rectangular voltage signal as a data signal;

receiving a second selected one of the rectangular current signal and the rectangular voltage signal as a clock signal;

detecting the rising edge group delay between the data signal and the clock signal;

detecting the falling edge group delay between the data signal and the clock signal; and determining the relative group delay between the modulated current and the modulated voltage based on the rising edge group delay and the falling edge group delay.

19. The method of claim 18, further comprising delaying the clock signal by a predefined delay that is shorter than one-half of a minimum clock cycle of the data signal and the clock signal.

20. The method of claim 16, further comprising:

receiving a first one of the rectangular current signal and the rectangular voltage signal as a data signal;

receiving a second one of the rectangular current signal and the rectangular voltage signal as a clock signal;

detecting a first rising edge group delay between the data signal and the clock signal;

receiving the second one of the rectangular current signal and the rectangular voltage signal as an inverted data signal;

receiving the first one of the rectangular current signal and the rectangular voltage signal as an inverted clock signal;

detecting a first falling edge group delay between the inverted data signal and the inverted clock signal;

receiving the second one of the rectangular current signal and the rectangular voltage signal as the data signal;

receiving the first one of the rectangular current signal and the rectangular voltage signal as the clock signal;

detecting a second rising edge group delay between the data signal and the clock signal;

receiving the first one of the rectangular current signal and the rectangular voltage signal as the inverted data signal;

receiving the second one of the rectangular current signal and the rectangular voltage signal as the inverted clock signal;

detecting a second falling edge group delay between the inverted data signal and the inverted clock signal; and determining the relative group delay between the modulated current and the modulated voltage based on the first rising edge group delay, the first falling edge group delay, the second rising edge group delay, and the second falling edge group delay.

* * * * *